(12) United States Patent
Jing

(10) Patent No.: US 11,087,962 B2
(45) Date of Patent: Aug. 10, 2021

(54) REAL-TIME CONTROL OF TEMPERATURE IN A PLASMA CHAMBER

(71) Applicant: Lam Research Corporation, Fremont, CA (US)

(72) Inventor: Changyou Jing, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 119 days.

(21) Appl. No.: 16/041,345

(22) Filed: Jul. 20, 2018

(65) Prior Publication Data

US 2020/0027706 A1 Jan. 23, 2020

(51) Int. Cl.
*H01J 37/32* (2006.01)
*H01L 21/67* (2006.01)
*G05B 19/418* (2006.01)
*C23C 16/50* (2006.01)

(52) U.S. Cl.
CPC ...... *H01J 37/32724* (2013.01); *G05B 19/418* (2013.01); *H01L 21/67069* (2013.01); *H01L 21/67103* (2013.01); *H01L 21/67248* (2013.01); *C23C 16/50* (2013.01); *G05B 2219/45031* (2013.01); *H01J 37/32183* (2013.01); *H01J 2237/332* (2013.01); *H01J 2237/3343* (2013.01)

(58) Field of Classification Search
None
See application file for complete search history.

(56) References Cited

U.S. PATENT DOCUMENTS

| 6,189,482 | B1 | 2/2001 | Zhao et al. | |
|---|---|---|---|---|
| 8,064,233 | B2* | 11/2011 | Ishizu | H01L 21/67248 |
| | | | | 219/663 |
| 2005/0063453 | A1* | 3/2005 | Camm | G01J 5/0003 |
| | | | | 374/161 |
| 2009/0310645 | A1 | 12/2009 | Kofuji et al. | |
| 2012/0237248 | A1* | 9/2012 | Aoki | G03G 15/5004 |
| | | | | 399/88 |
| 2016/0329231 | A1 | 11/2016 | Parkhe et al. | |
| 2016/0378092 | A1 | 12/2016 | Yamamoto et al. | |
| 2017/0094719 | A1* | 3/2017 | Voronin | H05B 1/0233 |
| 2017/0332481 | A1 | 11/2017 | Ohkura et al. | |
| 2018/0254208 | A1* | 9/2018 | Chang | G01J 5/047 |

OTHER PUBLICATIONS

ISR, PCT(US2019/042229, dated Nov. 5, 2019, 4 pages.

* cited by examiner

*Primary Examiner* — Sean Shechtman
(74) *Attorney, Agent, or Firm* — Penilla IP, APC

(57) ABSTRACT

Systems and methods for real-time control of temperature within a plasma chamber are described. One of the methods includes sensing a voltage in real time of a rail that is coupled to a voltage source. The voltage source supplies a voltage to multiple heater elements of the plasma chamber. The voltage that is sensed is used to adjust one or more duty cycles of corresponding one or more of the heater elements. The adjusted one or more duty cycles facilitate achieving and maintaining a temperature value within the plasma chamber over time.

26 Claims, 8 Drawing Sheets

(Voltage Sensor)
- Resistor Divider

Place resistor across Voltage Sensor
to measure current - current sensor
OR
Use a current sensor & place
resistor across current sensor
to measure voltage

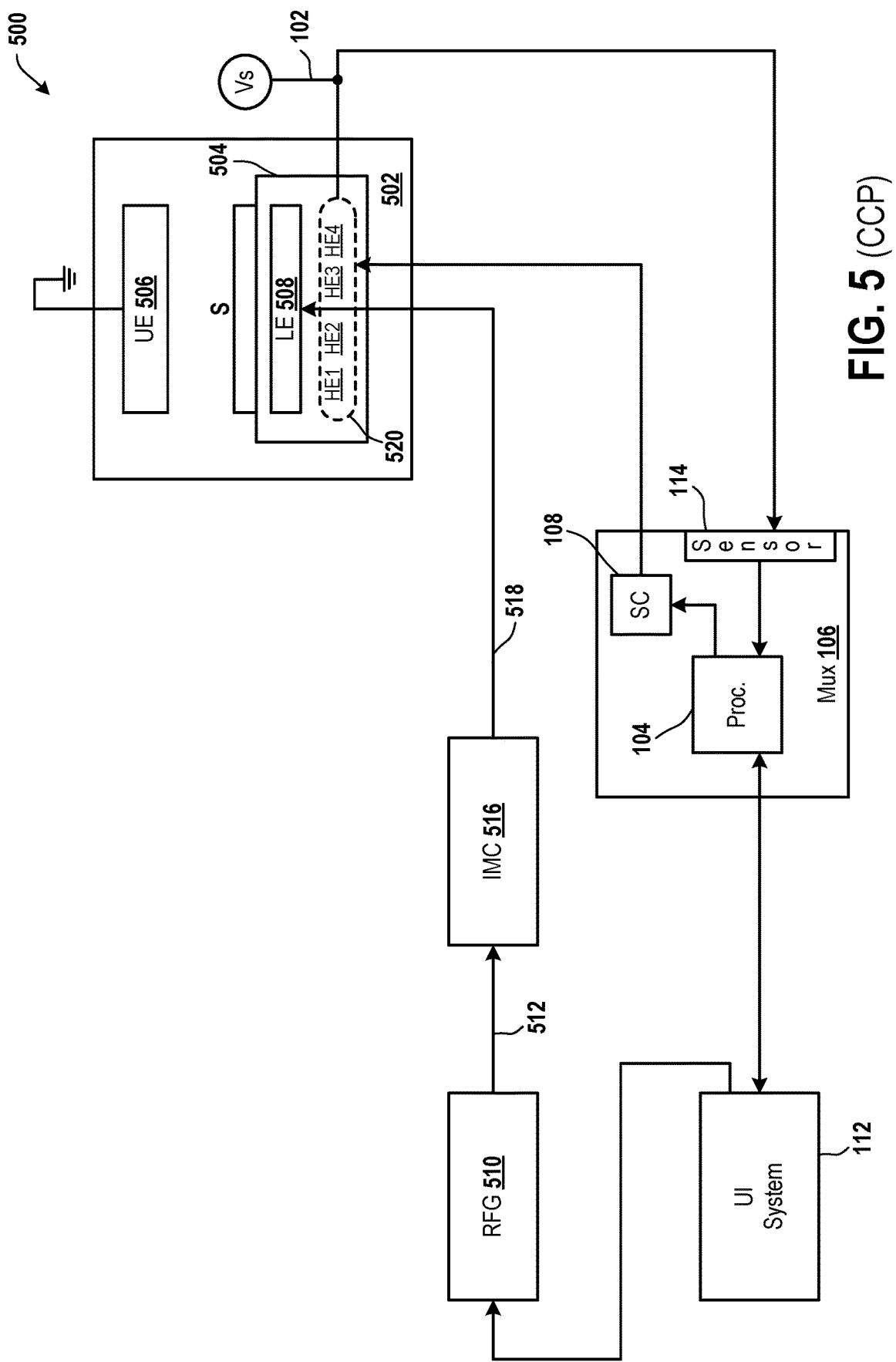
FIG. 5 (CCP)

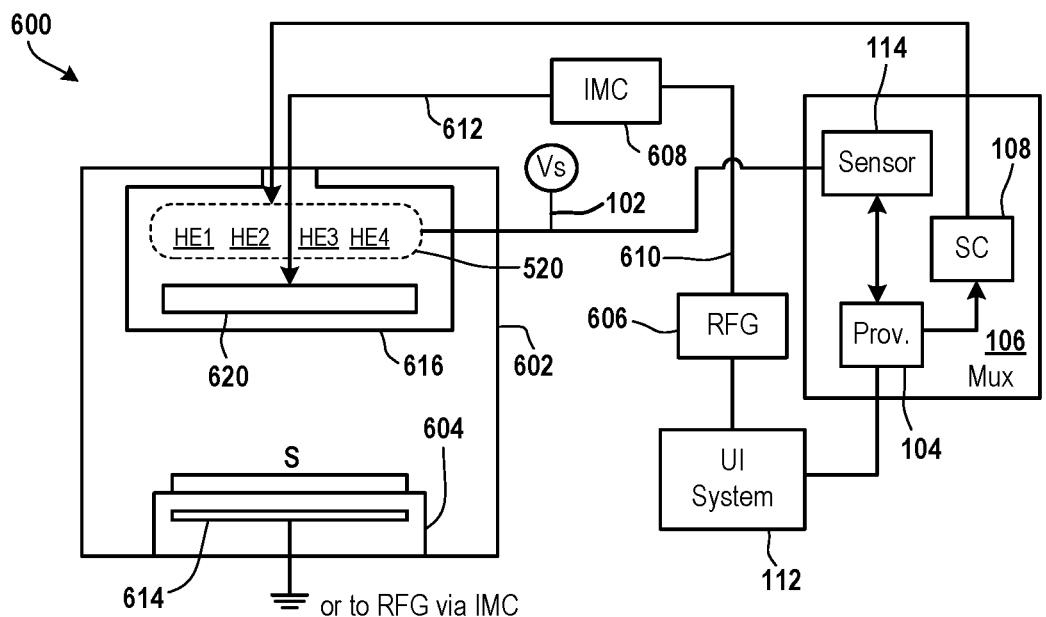
FIG. 6 (PECVD, PEALD)
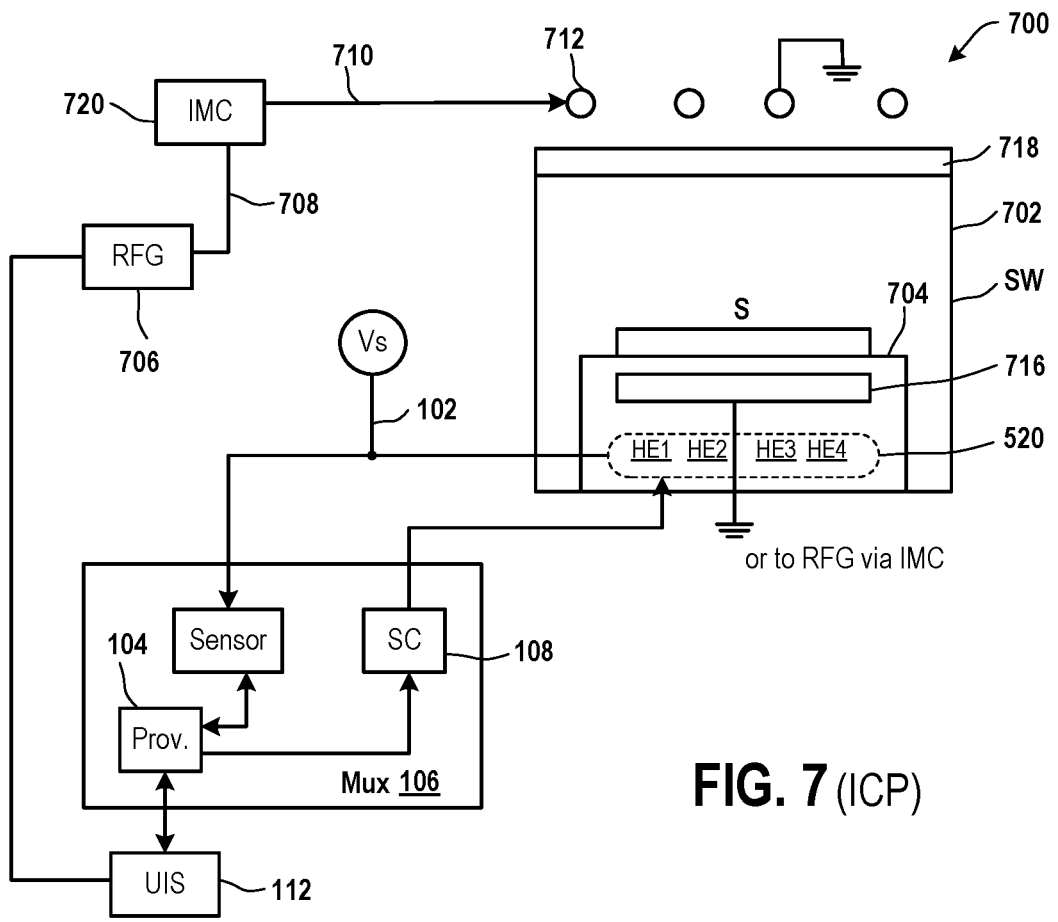
FIG. 7 (ICP)

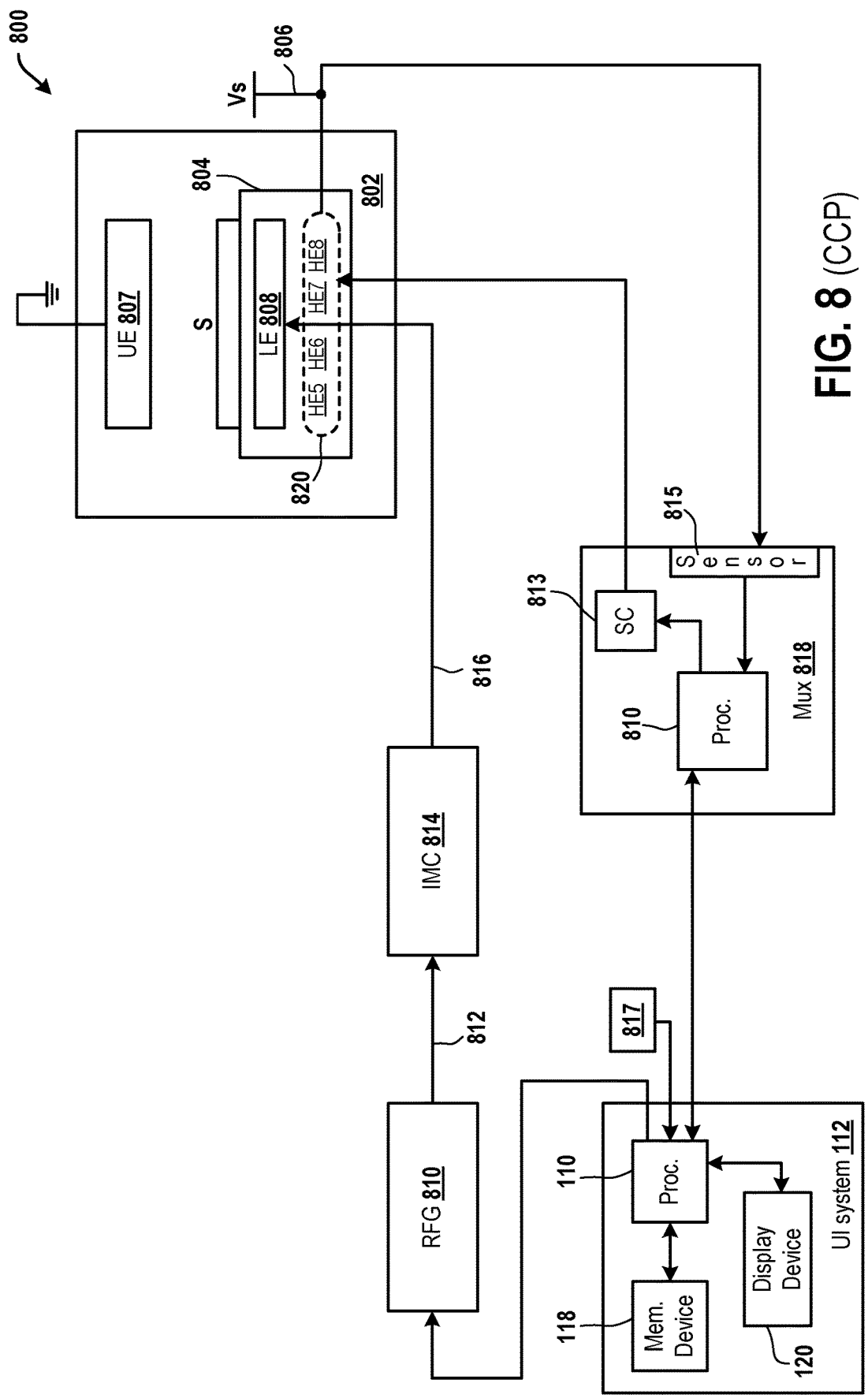
FIG. 8 (CCP)

REAL-TIME CONTROL OF TEMPERATURE IN A PLASMA CHAMBER

FIELD

The present disclosure relates to systems and methods for real-time control of temperature in a plasma chamber.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A plasma tool includes a radio frequency (RF) generator and a plasma chamber. The RF generator is coupled to the plasma chamber. The RF generator generates an RF signal and supplies the RF signal to the plasma chamber.

A substrate is processed within the plasma chamber using plasma that is generated when the RF signal is supplied to the plasma chamber in addition to one or more gases. It is important that temperature within the plasma chamber be substantially uniform to achieve uniformity in processing the substrate.

It is in this context that embodiments described in the present disclosure arise.

SUMMARY

Embodiments of the disclosure provide systems, apparatus, methods and computer programs for real-time control of temperature in a plasma chamber. It should be appreciated that the present embodiments can be implemented in numerous ways, e.g., a process, an apparatus, a system, a device, or a method on a computer readable medium. Several embodiments are described below.

A conductor or dielectric etch tool includes a matrix of heaters, such as heater elements, which are adjusted to run at different duty cycles to achieve a desired temperature uniformity or a special temperature pattern that includes a series of temperature values during processing of a wafer in a plasma chamber. A total amount of energy delivered onto a heater is linear with an on time of a duty cycle when an amount of voltage supplied by a power supply to the heater is substantially constant. The duty cycle is a portion of a clock cycle for which the heater is supplied with the amount of voltage. Therefore, a temperature of the heater has a known relationship with the duty cycle at which the heater is operated.

Sometimes, the matrix of heaters is controlled using an open-loop control. In the open-loop control, set points, such as duty cycles, of the matrix of heaters are calibrated to be at various profiles with an assumption that a voltage generated by the power supply and supplied via a power supply rail is constant, such as at a nominal value. To achieve the assumption, a tight specification at which the power supply is to supply voltage to the matrix of heaters is to be strictly followed, e.g., the voltage to be supplied by the power supply is limited to a specified level with little to no variance or deviation.

However, a voltage supplied by the power supply using the open-loop control has inaccuracies or fluctuations and, therefore, the voltage supplied may be different or deviate from the intended nominal value of the voltage. Moreover, the voltage supplied by the power supply may drift from the nominal value due to a change in temperature surrounding the power supply. Also, the voltage supplied by the power supply may ripple due to dynamic load regulation. In the dynamic load regulation, different ones of the heaters of the matrix consume different amounts of power from the power supply and therefore, the voltage supplied by the power supply ripples, such as deviates, from the nominal value. Therefore, the open-loop control is compromised, and there is a negative impact in uniformly heating a chuck, such as an electrostatic chuck (ESC). Also, there is a chamber-to-chamber and intra-chamber variation in temperature. The chamber-to-chamber variation and the intra-chamber variation result in non-uniformities in processing one or more substrates.

To achieve uniformity in supplying the voltage to various heaters, the power supply is regulated by a regulator. For example, the power supply includes the regulator or is coupled to the regulator to regulate an amount of voltage that is supplied by the power supply. The regulator used to regulate the voltage supplied by the power supply is expensive. Moreover, with the regulator, it is difficult to guarantee that the power supply will supply the voltage to the heaters of the matrix within a tight accuracy specification. As such, the nominal value is not always supplied. Moreover, the voltage ripples when the heaters of the matrix consume different amounts of power from the power supply. Even when the regulator is used, the ripples or drifts of the power supply are reflected on an amount of temperature to be achieved within the plasma chamber because there is none or minimal amount of compensation for the inaccuracies or ripples or drifts of the power supply.

In some embodiments, a real-time automatic compensation method to remove multiple effects of the inaccuracies or fluctuations of the power supply is described. The power supply that is used with the real-time automatic compensation method can have loose specifications and is cost-effective to manufacture. In the real-time automatic compensation method, a voltage sensor is employed to monitor voltage at the power supply rail in real time. Also, a digital signal processor (DSP) of a printed circuit board assembly polls the voltage sensor in real time. The DSP can receive set points from another device, such as an user interface system (UIS) via a communication medium. The set points are pre-calibrated at a factory in which the chuck is fabricated with the assumption that the power supply has the constant value, such as the nominal value. The DSP adjusts the duty cycles in real-time based on multiple voltage readings that are measured in real time by the voltage sensor according to a function $$\text{Adjusted Duty Cycle} = (V\text{-nominal}/V\text{-sense})^2 * \text{Original Duty Cycle},$$

where V-nominal is the nominal value, V-sense is a value of voltage sensed by the voltage sensor at the power supply rail, and Original Duty Cycle is a duty cycle of the heater of the matrix when the voltage is at the nominal value. The DSP controls multiple heater switching devices to switch to operate the heater at the adjusted duty cycle.

In some embodiments, a method for achieving a target temperature within a plasma chamber of a wafer processing system is described. The wafer processing system includes a plurality of heater elements disposed within the plasma chamber and a voltage source that supplies a voltage to the plurality of heater elements via a rail. The method includes maintaining mapping information between the target temperature and a plurality of duty cycles corresponding to the plurality of heater elements. The mapping information includes a nominal voltage associated with the voltage source. The method further includes measuring a parameter value at the rail and creating one or more adjusted duty cycles for corresponding ones of the plurality of heater elements based on at least one of the plurality of duty cycles, the nominal voltage, and the measured parameter value.

In various embodiments, a system for achieving a target temperature within a plasma chamber of the wafer processing system is described. The system includes a memory device configured to maintain mapping information between the target temperature and a plurality of duty cycles corresponding to the plurality of heater elements. The mapping information includes a nominal voltage associated with the voltage source. The system further includes a sensor configured to measure a parameter value at the rail. The system also includes a processor. The processor is configured to create one or more adjusted duty cycles for corresponding ones of the plurality of heater elements based on at least one of the plurality of duty cycles, the nominal voltage, and the measured parameter value.

Some advantages of the herein described systems and methods for real-time control of temperature in a plasma chamber include use of an inexpensive power supply, which is either unregulated or is regulated with loose regulation specifications to control the heaters of the matrix. Moreover, by applying the adjusted duty cycles, temperature within the plasma chamber is minimally affected by the ripples and drifts of the power supply. In some embodiments, there is no effect on the temperature within the plasma chamber by the ripples and drifts when the adjusted duty cycles are applied. Also, the temperature within the plasma chamber is controlled to be uniform over time to achieve etch uniformity in processing, such as etching, the wafer within the plasma chamber. Moreover, there is better chamber-to-chamber and intra-chamber repeatability of processing substrates due to real time compensation of variations in amounts of the voltage that is supplied by the power supply.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 5 is a diagram of an embodiment of a plasma system to illustrate use of the heater elements within a plasma system.

FIG. 6 is a diagram of an embodiment of a system to illustrate use of the heater elements within a showerhead of a plasma chamber.

FIG. 7 is a diagram of an embodiment of a system to illustrate use of the heater elements within an inductively coupled plasma (ICP) chamber.

FIG. 8 is a diagram of an embodiment of a system to illustrate chamber-to-chamber matching in which the same temperature value is achieved within a plasma chamber as that achieved within the plasma chamber of FIG. 5.

DETAILED DESCRIPTION

The following embodiments describe systems and methods for real-time control of temperature in a plasma chamber. It will be apparent that the present embodiments may be practiced without some or all of these specific details. In other instances, well known process operations have not been described in detail in order not to unnecessarily obscure the present embodiments.

Figure 1A:
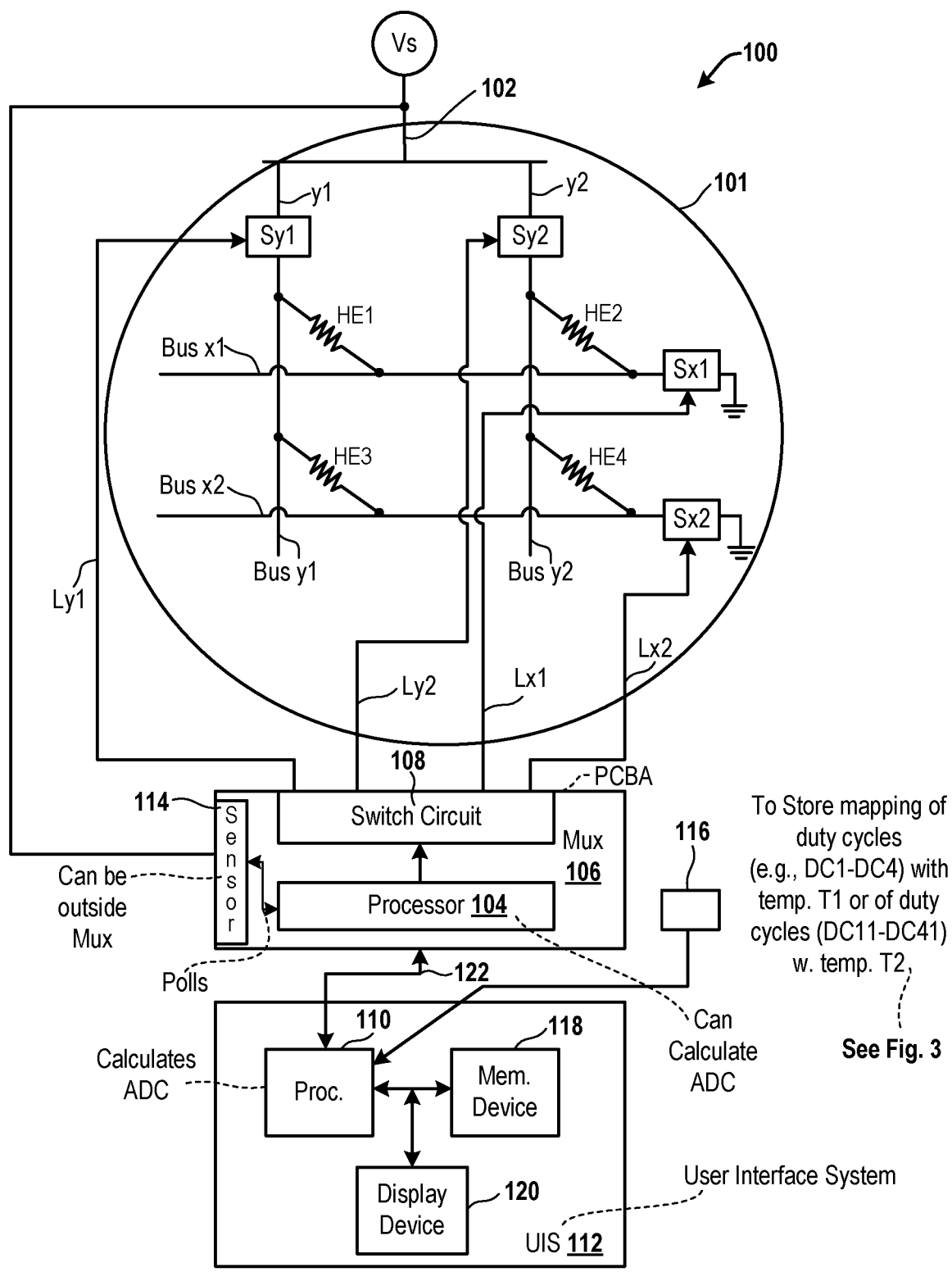
FIG. 1A is a diagram of an embodiment of a system to illustrate real-time control of temperature by controlling multiple heater elements in real time.

FIG. 1A is a diagram of an embodiment of a system 100 to illustrate real-time control of temperature by controlling multiple heater elements HE1, HE2, HE3, and HE4 in real time. The system 100 is an example of a wafer processing system. The system 100 includes a voltage source Vs, an electrode assembly 101, a multiplexer 106, a non-volatile memory 116, and a user interface system (UIS) 112. A multiplexer, as used herein, is fabricated as a printed circuit board assembly (PCBA). For example, the terms multiplexer and PCBA are used herein interchangeably. Examples of a non-volatile memory, as used herein, include a flash memory and a ferroelectric random access memory (RAM). An example of the voltage source Vs includes a power supply. To illustrate, the voltage source Vs supplies an amount of voltage. Examples of the electrode assembly 101 include a substrate support, a chuck, a showerhead, and an upper electrode assembly. The upper electrode assembly includes an upper electrode and other components, such as a dielectric that surrounds the upper electrode and an upper electrode extension that surrounds the dielectric. Examples of the user interface system 112 include a host computer, a desktop computer, a laptop computer, a smart phone, and a server.

The electrode assembly 101 includes multiple switches Sx1, Sx2, Sy1, and Sy2. In addition, the electrode assembly 101 includes multiple buses x1, x2, y1, and y2, and includes the heater elements HE1 through HE4. An example of a heater element, as used herein, is a resistor. An example of a bus, as used herein, is a conductor, such as a wire. An example of a switch, as used herein, is a relay. As another example, a switch, as used herein, includes one or more transistors that are coupled to each other.

The voltage source Vs is coupled to the ground potential in a number of ways. The voltage source Vs is coupled via a rail 102, the bus y1, the switch Sy1, the heater element HE1, the bus x1, and the switch Sx1 to a ground potential. Moreover, the voltage source Vs is coupled via the rail 102, the bus y2, the switch Sy2, the heater element HE2, the bus x1, and the switch Sx1 to the ground potential. Also, the voltage source Vs is coupled via the rail 102, the bus y1, the switch Sy1, the heater element HE3, the bus x2, and the switch Sx2 to the ground potential. The voltage source Vs is coupled via the rail 102, the bus y2, the switch Sy2, the heater element HE4, the bus x2, and the switch Sx2 to the ground potential.

In some embodiments, the voltage source Vs is loosely regulated. To illustrate, the voltage source Vs is designed to generate a voltage value Vnominal1 to supply a range of voltage amounts. The voltage value Vnominal1 is an example of the mapping information. The range of voltage amounts can be outside a specified range of voltage amounts. As an illustration, the specified range is according to a specification, which can be printed on another voltage source that is strictly regulated to operate within the specified range.

In various embodiments, the voltage source Vs is not regulated. As an illustration, there is no need to include a parameter regulator within the voltage source Vs or there is no need to couple the parameter regulator to the voltage source Vs to regulate the voltage amounts supplied by the voltage source Vs to be within the specified range. To further illustrate, the voltage source Vs excludes the parameter regulator. The parameter regulator when and if used with or within the voltage source Vs regulates the voltage amounts that are supplied by the voltage source Vs to be within the specified range.

The multiplexer 106 includes a switch circuit 108, a processor 104, and a sensor 114. The processor 104 is coupled to the switch circuit 108 and to the sensor 114. The sensor 114 is coupled to a point on the rail 102, which is coupled to the voltage source Vs. The rail 102 is coupled between the bus y1 and the voltage source Vs and is between the bus y2 and the voltage source Vs. The rail 102 is coupled to the buses y1 and y2. The switch circuit 108 is coupled via a line Ly1 to the switch Sy1, via a line Ly2 to the switch Sy2, via a line Lx1 to the switch Sx1, and via a line Lx2 to the switch Sx2. An example of a line, as used herein, is a conductor, such as a wire.

As used herein, a processor is an application specific integrated circuit (ASIC), or a field programmable gate array (FPGA), a programmable logic device (PLD), or a central processing unit (CPU), or a microprocessor, or a digital signal processor, or a microcontroller. Examples of a memory device, as used herein, include a random access memory (RAM) and a read-only memory (ROM). To illustrate, a memory device is a flash memory, a hard disk, or a storage device, etc. A memory device is an example of a computer-readable medium. An example of the switch circuit 108 includes a circuit that includes multiple switches (not shown), such as tri-state buffers or transistors. An example of the sensor 114 includes a voltage sensor that senses voltage supplied by the voltage source Vs at the point on the rail 102. As such, the voltage that is sensed relates to the voltage that is supplied by the voltage source Vs. Another example of the sensor 114 includes a combination of a current sensor and a resistor coupled to the current sensor. The current sensor senses a current generated from the voltage that is supplied by the voltage source Vs to the rail 102. The resistor that is coupled to the current sensor measures a voltage across the resistor generated from the current to sense the voltage at the point on the rail 102. Voltage is an example of a parameter.

The user interface system 112 includes a processor 110, a memory device 118, and a display device 120. Examples of the display device 120 include a liquid crystal display device, a light emitting diode display device, and a plasma display device. The non-volatile memory 116 is coupled to the processor 110 via a transfer cable. The processor 110 is coupled to the memory device 118 and the display device 120 via one or more buses. Moreover, the processor 110 is coupled to the processor 104 of the multiplexer 106 via a transfer cable 122. Examples of a transfer cable, as used herein, include a parallel transfer cable that facilitates a parallel transfer of data between the processors 104 and 110, a serial transfer cable that facilitates a serial transfer of the data, and a universal serial bus (USB) cable.

The nonvolatile memory 116 includes one or more mappings, such as a one-to-one relationship, or a correspondence, or a link, or a unique relationship, etc., among a temperature value to be achieved within the plasma chamber, duty cycles of operation of the heater elements HE1 through HE4, and a nominal value of the voltage to be generated by the voltage source Vs. Illustration of the mappings is provided in FIG. 3. A mapping, as used herein, is sometimes referred to herein as mapping information. As illustrated in a mapping 306, to achieve a temperature value Temp1 within the plasma chamber that includes the heater elements HE1 through HE4, the voltage source Vs is to be operated to generate the nominal voltage amount Vnominal1, the heater element HE1 is to be operated at a duty cycle DC1, the heater element HE2 is to be operated at a duty cycle DC2, the heater element HE3 is to be operated at a duty cycle DC3, and the heater element HE4 is to be operated at a duty cycle DC4. As another example, as illustrated in a mapping 308, to achieve a temperature value Temp2 within the plasma chamber that includes the heater elements HE1 through HE4, the voltage source Vs is to be operated to generate the nominal voltage amount Vnominal1, the heater element HE1 is to be operated at a duty cycle DC11, the heater element HE2 is to be operated at a duty cycle DC21, the heater element HE3 is to be operated at a duty cycle DC31, and the heater element HE4 is to be operated at a duty cycle DC41. In various embodiments, the terms map and mapping are used herein interchangeably. Each temperature Temp1 and Temp2 is an example of a target temperature.

It should be noted that in some embodiments, in the above two preceding examples, one or more of the duty cycles DC11 through DC41 at which the heater elements HE1 through HE4 are to be operated to achieve the temperature Temp2 is changed to corresponding one or more of the duty cycles DC1 through DC4 at which the heater elements HE1 through HE4 are to be operated to achieve the temperature Temp1. For example, instead of the duty cycle DC11, the heater element HE1 is operated at the duty cycle DC1 and instead of the duty cycle DC21, the heater element HE2 is operated at the duty cycle DC2 to achieve the temperature Temp2.

It should further be noted that the non-volatile memory 116 is preloaded with mappings that are specific to the corresponding electrode assembly 101 upon delivery of the electrode assembly 101 to the user. For example, the mapping that is stored in the non-volatile memory 116 is specific to the electrode assembly 101 having the heater elements HE1 through HE4 and can be different for another electrode assembly having another set of heater elements. As another example, the duty cycles DC1 through DC4 are pre-calibrated at a factory in which the electrode assembly 101 is fabricated with an assumption that the voltage source Vs will generate and supply voltage at a constant value, such as the nominal value Vnominal1. Information regarding off and on time periods of the duty cycles DC1 through DC4 are calculated and stored in the non-volatile memory 116 at the factory prior to delivery to the user.

It should be noted that in some embodiments, the terms storing and maintaining are used interchangeably herein. For example, mapping information is maintained within a memory device by being stored in the memory device.

The processor 110 receives, such as accesses, the one or more mappings, such as the mappings 306 and 308, from the non-volatile memory 116 and identifies from the one or more mappings the duty cycles DC1 through DC4 at which the heater elements HE1 through HE4 are to be operated to achieve the temperature value Temp1. The voltage source Vs is capable of generating the nominal voltage value Vnominal1 for achieving the temperature value Temp1. The temperature value Temp1 is to be achieved as a part of a recipe for processing a substrate within the plasma chamber. As used herein, an example of a substrate includes a semiconductor wafer, which can be a test wafer or a wafer that is to be processed. For example, the substrate includes multiple stack layers that are overlaid on a substrate layer, such as silicon. The recipe includes other values, such as an operating frequency of a radiofrequency (RF) generator, an operating power level of the RF generator, a gap between the upper electrode and a lower electrode within the plasma chamber, an amount of pressure within the plasma chamber, and a chemistry of process gases to be supplied within the plasma chamber. The processor 110 accesses the recipe, which is stored in the memory device 118, and controls the RF generator and the plasma chamber accordingly to carry out the recipe.

During processing of the substrate within the plasma chamber, the voltage source Vs generates the nominal voltage value Vnominal1 for supply via the rail 102 to one or more of the heater elements HE1 through HE4. Moreover, during processing of the substrate, the processor 110 identifies from the recipe that the temperature value Temp1 is to be achieved within the plasma chamber. When the substrate is being processed, the processor 110 sends duty-cycle control signal(s) to the processor 104 for controlling the heater elements HE1-HE4 to achieve their respective duty cycles DC1-DC4. The duty-cycle control signal(s) includes frequencies for opening and closing the switches Sx1, Sx2, Sy1, and Sy2 to achieve the duty cycles DC1 through DC4. Upon receiving the duty-cycle control signal(s), the processor 104 generates and sends multiple duty-cycle select signals and sends the duty-cycle select signals to the switch circuit 108 to direct or control the switch circuit 108.

In response to receiving the duty-cycle select signals, the switch circuit 108 manages the closing and opening of the switches Sy1, Sy2, Sx1 and Sx2 accordingly to achieve the desired duty cycles DC1 through DC4. For example, when a first one of the switches of the switch circuit 108 is closed and remaining three switches of the switch circuit 108 are open, a first one of the duty-cycle select signals is transferred via the first switch of the switch circuit 108 and the line Ly1 to the switch Sy1 to close the switch Sy1. Also, when a second one of the switches of the switch circuit 108 is closed and the remaining three switches of the switch circuit 108 are open, a second one of the duty-cycle select signals is transferred via the second switch of the switch circuit 108 and the line Ly2 to the switch Sy2 to close the switch Sy2. Moreover, when a third one of the switches of the switch circuit 108 is closed and the remaining three switches of the switch circuit 108 are open, a third one of the duty-cycle select signals is transferred via the third switch of the switch circuit 108 and the line Lx1 to the switch Sx1 to close the switch Sx1. When a fourth one of the switches of the switch circuit 108 is closed and the remaining three switches of the switch circuit 108 are open, a fourth one of the duty-cycle select signals is transferred via the fourth switch of the switch circuit 108 and the line Lx2 to the switch Sx2 to close the switch Sx2.

All the switches of the switch circuit 108 remain open until they receive the duty-cycle select signals. For example, during a time period in which the first duty-cycle select signal is not received from the processor 104, the first switch of the switch circuit 108 remains open. During the time period in which the first switch of the switch circuit 108 remains open, the switch Sy1 also remains open. As another example, during a time period in which the second duty-cycle select signal is not received from the processor 104, the second switch of the switch circuit 108 remains open. During the time period in which the second switch of the switch circuit 108 remains open, the switch Sy2 also remains open. As yet another example, during a time period in which the third duty-cycle select signal is not received from the processor 104, the third switch of the switch circuit 108 remains open. During the time period in which the third switch of the switch circuit 108 remains open, the switch Sx1 also remains open. As still another example, during a time period in which the fourth duty-cycle select signal is not received from the processor 104, the fourth switch of the switch circuit 108 remains open. During the time period in which the fourth switch of the switch circuit 108 remains open, the switch Sx2 remains open.

During a time period in which the switches Sy1 and Sx1 are closed upon receiving the first and third duty-cycle select signals, the nominal voltage that is generated by the voltage source Vs is transferred via the rail 102, the bus y1, the switch Sy1, the heater element HE1, the bus x1, and the switch Sx1 to the ground potential to achieve an on period of the duty cycle DC1. As an example, an on period of a duty cycle is a time period of a clock cycle as a percentage of the clock cycle for which the on period occurs. In the example, the on period of the duty cycle defines the duty cycle as a percentage of the clock cycle.

Similarly, during a time period in which the switch Sy1 or Sx1 is open, the nominal voltage that is generated by the voltage source Vs is not transferred via the rail 102, the bus y1, the switch Sy1, the heater element HE1, the bus x1, and the switch Sx1 to the ground potential to achieve an off period associated with the duty cycle DC1. As an example, an off period associated with a duty cycle is a time period of the clock cycle as a percentage of the clock cycle for which the off period occurs. Continuing with the example, the off period of the duty cycle of the clock cycle consecutively follows the duty cycle of the clock cycle. In the example, the duty cycle of the clock cycle precedes the off period of the clock cycle and the duty cycle is an on period of the clock cycle. To illustrate, the off period of the duty cycle defines a remaining portion of the clock cycle during which the on period does not occur. In some embodiments, the terms "off period associated with a/the duty cycle" and "off period of a/the duty cycle" as used herein interchangeably herein.

Moreover, during a time period in which the switches Sy2 and Sx1 are closed upon receiving the second and third duty-cycle select signals, the nominal voltage that is generated by the voltage source Vs is transferred via the rail 102, the bus y2, the switch Sy2, the heater element HE2, the bus x1, and the switch Sx1 to the ground potential to achieve an on period of the duty cycle DC2. Similarly, during a time period in which the switch Sy2 or Sx1 is open, the nominal voltage that is generated by the voltage source Vs is not transferred via the rail 102, the bus y2, the switch Sy2, the heater element HE2, the bus x1, and the switch Sx1 to the ground potential to achieve an off period of the duty cycle DC2.

Also, during a time period in which the switches Sy1 and Sx2 are closed upon receiving the first and fourth duty-cycle select signals, the nominal voltage that is generated by the voltage source Vs is transferred via the rail 102, the bus y1, the switch Sy1, the heater element HE3, the bus x2, and the switch Sx2 to the ground potential to achieve an on period of the duty cycle DC3. Similarly, during a time period in which the switch Sy1 or Sx2 is open, the nominal voltage that is generated by the voltage source Vs is not transferred via the rail 102, the bus y1, the switch Sy1, the heater element HE3, the bus x2, and the switch Sx2 to the ground potential to achieve an off period of the duty cycle DC3.

Furthermore, a time period in which the switches Sy2 and Sx2 are closed upon receiving the second and fourth duty-cycle select signals, the nominal voltage that is generated by the voltage source Vs is transferred via the rail 102, the bus y2, the switch Sy2, the heater element HE4, the bus x2, and the switch Sx2 to the ground potential to achieve an on period of the duty cycle DC4. Similarly, during a time period in which the switch Sy2 or Sx2 is open, the nominal voltage that is generated by the voltage source Vs is not transferred via the rail 102, the bus y2, the switch Sy2, the heater element HE4, the bus x2, and the switch Sx2 to the ground potential to achieve an off period of the duty cycle DC4.

During a time period in which the nominal voltage amount Vnominal1 is being generated by the voltage source Vs for achieving the temperature value Temp1 and heater elements HE1 through HE4 are operated at the corresponding duty cycles DC1 through DC4, the sensor 114 measures a voltage Vsense1 that is present on the rail 102. The sensor 114 then provides information about the voltage Vsense1 to the processor 104. For example, the processor 104 polls the sensor 114 to obtain the information about voltage Vsense1 from the sensor 114. The processor 104 periodically or continuously, in real time, polls the sensor 114 to obtain information about multiple measured voltages. To illustrate, the processor 104 polls, such as sends a poll signal to, the sensor 114 every few microseconds or every few milliseconds. It should be noted that one or more microseconds is an example of few microseconds and one or more milliseconds is an example of few milliseconds. It should be noted that in some embodiments, the terms periodically and on a periodic basis are used interchangeably herein.

In response to receiving the poll signal from the processor 104, the sensor 114 provides the information about the voltage Vsense1 to the processor 104. The processor 104, in turn, sends the information about the voltage Vsense1 to the processor 110.

Upon receiving the information about the voltage Vsense1, the processor 110 calculates adjusted duty cycles (ADCs), if any, for the heater elements HE1 through HE4 from the duty cycles DC1 through DC4, the nominal voltage value Vnominal1 generated by the voltage source Vs, and the voltage Vsense1. For example, the processor 110 calculates an adjusted duty cycle ADC1 for the heater element HE1 to be a product of the duty cycle DC1 and a square of a ratio of the voltage value Vnominal1 and the voltage Vsense1. To illustrate, the adjusted duty cycle ADC1 is equal to $(Vnominal1/Vsense1)^2 \times DC1$. As another example, the processor 110 calculates an adjusted duty cycle ADC2 for the heater element HE2 to be a product of the duty cycle DC2 and a square of a ratio of the voltage value Vnominal1 and the voltage value Vsense1. To illustrate, the adjusted duty cycle ADC2 is equal to $(Vnominal1/Vsense1)^2 \times DC2$. As yet another example, the processor 110 calculates an adjusted duty cycle ADC3 for the heater element HE3 to be a product of the duty cycle DC3 and a square of a ratio of the voltage value Vnominal1 and the voltage value Vsense1. To illustrate, the adjusted duty cycle ADC3 is equal to $(Vnominal1/Vsense1)^2 \times DC3$. As still another example, the processor 110 calculates an adjusted duty cycle ADC4 for the heater element HE4 to be a product of the duty cycle DC4 and a square of a ratio of the voltage value Vnominal1 and the voltage value Vsense1. To illustrate, the adjusted duty cycle ADC4 is equal to $(Vnominal1/Vsense1)^2 \times DC4$.

After the adjusted duty cycles ADC1 through ADC4 have been calculated, the processor 110 sends adjusted-duty-cycle control signal(s) to the processor 104 for controlling the heater element HE1 to achieve the adjusted duty cycle ADC1, for controlling the heater element HE2 to achieve the adjusted duty cycle ADC2, for controlling the heater element HE3 to achieve the adjusted duty cycle ADC3, and for controlling the heater element HE4 to achieve the adjusted duty cycle ADC4. For example, the processor 110 generates and sends the adjusted-duty-cycle control signal(s) to the processor 104 within a few microseconds, such as one or more microseconds, after sending the duty-cycle control signal(s). As another example, the processor 110 generates and sends the adjusted-duty-cycle control signal(s) to the processor 104 within a few milliseconds, such as one or more milliseconds, after sending the duty-cycle control signal(s). By adjusting one or more of the duty cycles DC1 through DC4 every few milliseconds or microseconds, the duty cycles DC1 through DC4 are adjusted in real time. Moreover, by adjusting one or more of the duty cycles DC1 through DC4 while the substrate is being processed within the plasma chamber, the duty cycles DC1 through DC4 are adjusted in real time. Upon receiving the adjusted-duty-cycle control signal(s) from the processor 110, the processor 104 generates and sends multiple adjusted-duty-cycle select signals and sends the adjusted-duty-cycle select signals to the switch circuit 108 to direct the switch circuit 108. The adjusted-duty-cycle control signal(s) includes frequencies for opening and closing the switches Sx1, Sx2, Sy1, and Sy2 to achieve the duty cycles ADC1 through ADC4.

In response to receiving the adjusted-duty-cycle select signals, the switch circuit 108 closes some of its switches and maintains remaining ones of the switches as open to achieve the adjusted duty cycles ADC1 through ADC4. For example, when the first switch of the switch circuit 108 is closed, a first one of the adjusted-duty-cycle select signals is transferred via the first switch of the switch circuit 108 and the line Ly1 to the switch Sy1 to close the switch Sy1. Also, when the second switch of the switch circuit 108 is closed, a second one of the adjusted-duty-cycle select signals is transferred via the second switch of the switch circuit 108 and the line Ly2 to the switch Sy2 to close the switch Sy2. Moreover, when a third one of the switches of the switch circuit 108 is closed, a third one of the adjusted-duty-cycle select signals is transferred via the third switch of the switch circuit 108 and the line Lx1 to the switch Sx1 to close the switch Sx1. When the fourth switch of the switch circuit 108 is closed, a fourth one of the adjusted-duty-cycle select signals is transferred via the fourth switch of the switch circuit 108 and the line Lx2 to the switch Sx2 to close the switch Sx2.

The switches of the switch circuit 108 remain open until they receive the adjusted-duty-cycle select signals. For example, during a time period in which the first adjusted-duty-cycle select signal is not received from the processor 104, the first switch of the switch circuit 108 remains open.

During the time period in which the first switch of the switch circuit 108 remains open, the switch Sy1 also remains open. As another example, during a time period in which the second adjusted-duty-cycle select signal is not received from the processor 104, the second switch of the switch circuit 108 remains open. During the time period in which the second switch of the switch circuit 108 remains open, the switch Sy2 also remains open. As yet another example, during a time period in which the third adjusted-duty-cycle signal is not received from the processor 104, the third switch of the switch circuit 108 remains open. During the time period in which the third switch of the switch circuit 108 remains open, the switch Sx1 also remains open. As still another example, during a time period in which the fourth adjusted-duty-cycle select signal is not received from the processor 104, the fourth switch of the switch circuit 108 remains open. During the time period in which the fourth switch of the switch circuit 108 remains open, the switch Sx2 remains open.

During a time period in which the switches Sy1 and Sx1 are closed upon receiving the first and third adjusted-duty-cycle select signals, the nominal voltage that is generated by the voltage source Vs is transferred via the rail 102, the bus y1, the switch Sy1, the heater element HE1, the bus x1, and the switch Sx1 to the ground potential to achieve an on period of the adjusted duty cycle ADC1. As an example, an on period of an adjusted duty cycle is a time period of the clock cycle as a percentage of the clock cycle for which the on period occurs. To illustrate, the on period of the adjusted duty cycle defines the adjusted duty cycle as a percentage of the clock cycle.

Similarly, during a time period in which the switch Sy1 or Sx1 is open, the nominal voltage that is generated by the voltage source Vs is not transferred via the rail 102, the bus y1, the switch Sy1, the heater element HE1, the bus x1, and the switch Sx1 to the ground potential to achieve an off period associated with the adjusted duty cycle ADC1. As an example, an off period associated with an adjusted duty cycle is a time period of the clock cycle as a percentage of the clock cycle for which the off period occurs. Continuing with the example, the off period of the adjusted duty cycle of the clock cycle consecutively follows the adjusted duty cycle of the clock cycle. In the example, the adjusted duty cycle of the clock cycle precedes the off period of the clock cycle and the adjusted duty cycle is an on period of the clock cycle. To illustrate, the off period of the adjusted duty cycle defines a remaining portion of the clock cycle during which the on period of the adjusted duty cycle does not occur. In some embodiments, the terms "off period associated with an/the adjusted duty cycle" and "off period of an/the adjusted duty cycle" as used herein interchangeably herein.

Moreover, during a time period in which the switches Sy2 and Sx1 are closed upon receiving the second and third adjusted-duty-cycle select signals, the nominal voltage that is generated by the voltage source Vs is transferred via the rail 102, the bus y2, the switch Sy2, the heater element HE2, the bus x1, and the switch Sx1 to the ground potential to achieve an on period of the adjusted duty cycle ADC2. Similarly, during a time period in which the switch Sy2 or Sx1 is open, the nominal voltage that is generated by the voltage source Vs is not transferred via the rail 102, the bus y2, the switch Sy2, the heater element HE2, the bus x1, and the switch Sx1 to the ground potential to achieve an off period of the adjusted duty cycle ADC2.

Also, during a time period in which the switches Sy1 and Sx2 are closed upon receiving the first and fourth adjusted-duty-cycle select signals, the nominal voltage that is generated by the voltage source Vs is transferred via the rail 102, the bus y1, the switch Sy1, the heater element HE3, the bus x2, and the switch Sx2 to the ground potential to achieve an on period of the adjusted duty cycle ADC3. Similarly, during a time period in which the switch Sy1 or Sx2 is open, the nominal voltage that is generated by the voltage source Vs is not transferred via the rail 102, the bus y1, the switch Sy1, the heater element HE3, the bus x2, and the switch Sx2 to the ground potential to achieve an off period of the adjusted duty cycle ADC3.

Furthermore, a time period in which the switches Sy2 and Sx2 are closed upon receiving the second and fourth adjusted-duty-cycle select signals, the nominal voltage that is generated by the voltage source Vs is transferred via the rail 102, the bus y2, the switch Sy2, the heater element HE4, the bus x2, and the switch Sx2 to the ground potential to achieve an on period of the adjusted duty cycle ADC4. Similarly, during a time period in which the switch Sy2 or Sx2 is open, the nominal voltage that is generated by the voltage source Vs is not transferred via the rail 102, the bus y2, the switch Sy2, the heater element HE4, the bus x2, and the switch Sx2 to the ground potential to achieve an off period of the adjusted duty cycle ADC4. The duty cycles DC1 through DC4 are modified, such as increased or decreased, to the corresponding adjusted duty cycles ADC1 through ADC4 to achieve the temperature value Temp1 of the recipe for processing the substrate. Chances of the temperature value Temp1 being achieved with one or more of the adjusted duty cycles ADC1 through ADC4 are substantially higher compared to chances of the temperature value Temp1 being achieved with the duty cycles DC1 through DC4.

In this manner, the processor 110 continues to receive additional measured values, such as Vsense, of the voltage that is measured by the sensor 114 at the rail 102 after receiving the initial voltage value Vsense1 and applies the additional measured values to modify, such as increase or decrease, the adjusted duty cycles ADC1 through ADC4 of the corresponding heater elements HE1 through HE4 to achieve the temperature Temp1 within the plasma chamber for processing the substrate. By adjusting one or more of the adjusted duty cycles ADC1 through ADC4 every few milliseconds or microseconds, the duty cycles ADC1 through ADC4 are adjusted in real time. Moreover, by adjusting one or more of the duty cycles ADC1 through ADC4 while the substrate is being processed within the plasma chamber, the duty cycles ADC1 through ADC4 are adjusted in real time.

In some embodiments, adjustment to one or more of the duty cycles DC1 through DC4 in real time or adjustment to one or more of the adjusted duty cycles ADC1 through ADC4 in real time can be performed without any substrate being processed. Such adjustments may be performed to recondition or recalibrate the plasma chamber. For example, the plasma chamber may be cleaned by adjusting one or more of the duty cycles DC1 through DC4 to apply the corresponding one or more of the adjusted duty cycles ADC1 through ADC4 in real time or by adjusting the one or more adjusted duty cycles ADC1 through ADC4 in real time. In this example, the plasma chamber excludes the substrate.

In some embodiments, the electrode assembly 101 includes any number of heater elements, any number of switches, and any number of buses. For example, the electrode assembly 101 includes 144 heater elements. As another example, the electrode assembly 101 includes 100 heater elements.

In various embodiments, instead of a ground potential, a reference potential, such as a positive amount of potential or a negative amount of potential is used. The positive amount of potential and the negative amount of potential are less than a potential of the voltage source Vs.

In some embodiments, the voltage source Vs includes the parameter regulator.

In several embodiments, instead of the switches of the switch circuit 108 closing upon receiving the duty-cycle select signals or the adjusted-duty-cycle select signals from the processor 104, the switches of the switch circuit 108 open upon receiving multiple duty-cycle deselect signals or the adjusted-duty-cycle deselect signal from the processor 104. The switches of the switch circuit 108 remain closed during time periods in which the switches of the switch circuit 108 do not receive the duty-cycle deselect signals from the processor 104. Similarly, the switches of the switch circuit 108 remain closed during time periods in which the switches of the switch circuit 108 do not receive the adjusted-duty-cycle deselect signals from the processor 104.

Moreover, in some embodiments, one or more of the operations described herein as being performed by the processor 110 for calculating the adjusted duty cycles ADC1 through ADC4 and controlling or directing the switch circuit 108 to implement the adjusted duty cycles ADC1 through ADC4 are performed by the processor 104. For example, instead of the processor 110 computing the adjusted duty cycles ADC1 through ADC4 from the corresponding duty cycles DC1 through DC4, the processor 104 of the multiplexer 106 computes the adjusted duty cycles ADC1 through ADC4 in the same manner in which the processor 110 computes the adjusted duty cycles ADC1 through ADC4. There is no generation of the duty-cycle control signal or the adjusted-duty-cycle control signal. Rather, the processor 104 generates the duty-cycle select signal or the adjusted-duty-cycle select signal to control or direct the switch circuit 108 to change the duty cycles DC1 through DC4 or change the adjusted duty cycles ADC1 through ADC4. Also, in these embodiments, the processor 104 receives the mapping, such as the mapping 306 and/or the mapping 308, from the processor 110 for storage in a memory device coupled to the processor 104 and for access of the mapping from the memory device.

In some embodiments, instead of one sensor 114, multiple sensors, such as the sensor 114, are used to sense voltage in real time at the rail 102. The voltage amounts sensed by the multiple sensors are provided to a processor, such as the processor 104 or 110, to calculate multiple adjusted duty cycles from a duty cycle of one of the heater elements HE1 through HE4 based on the multiple measured values of the voltage at the rail 102. The processor 104 or 110 generates a statistically adjusted duty cycle, such as an average or a median, from the calculated multiple adjusted duty cycles, and implements the statistically adjusted duty cycle for the one of the heater elements HE1 through HE4. For example, the statistically adjusted duty cycle is applied to the one of the heater elements HE1 through HE4. Similarly, additional statistically adjusted duty cycles for the remaining ones of the heater elements HE1 through HE4 are created or calculated and applied to the remaining heater element(s).

In various embodiments, the sensor 114 is located outside the multiplexer 106 and is located between the multiplexer 106 and the rail 102. The sensor 114 is coupled to the processor 104 at one end of the sensor 114 and is coupled to the point on the rail 102 at another end of the sensor 114.

Figure 1B:
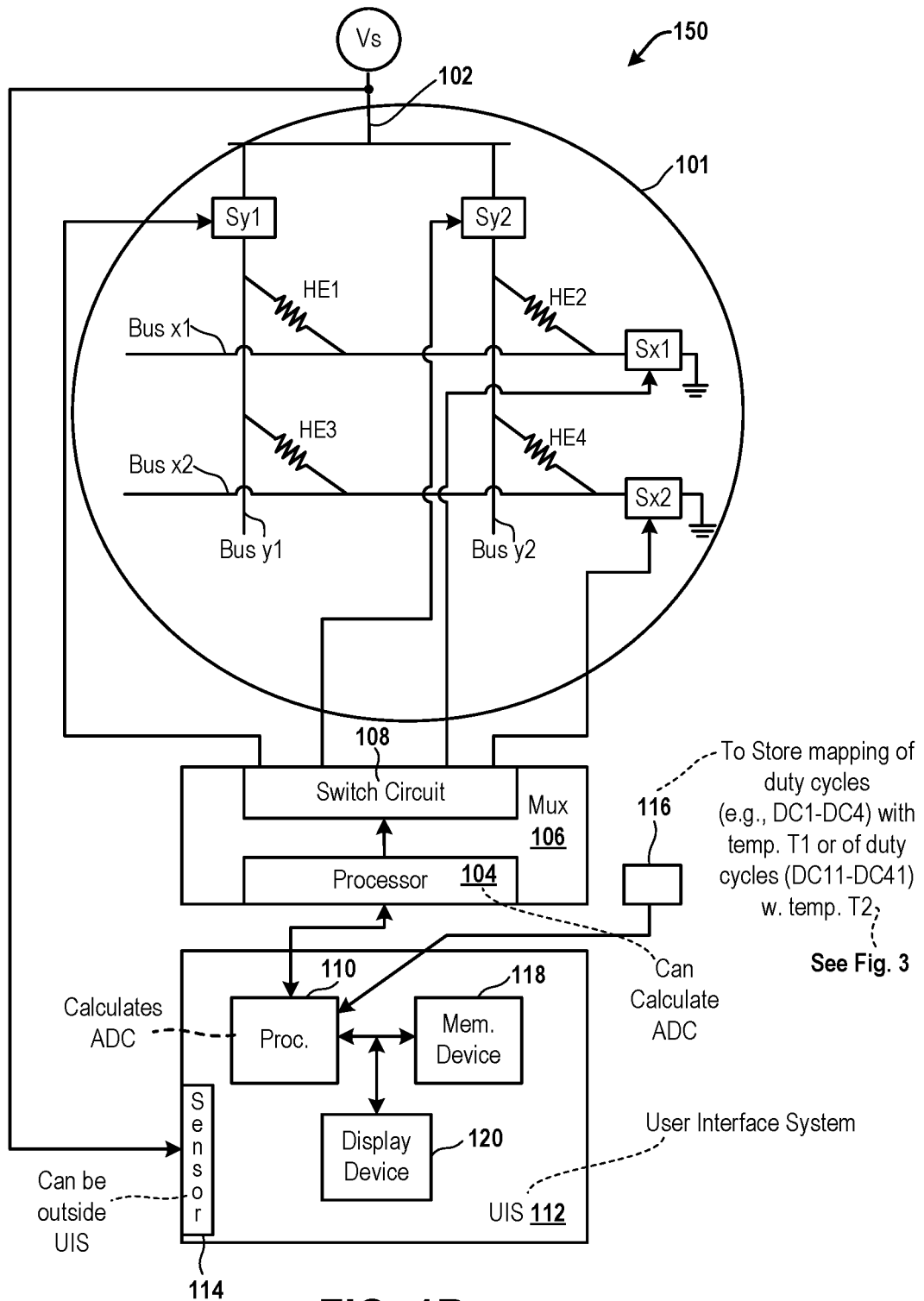
FIG. 1B is an embodiment of a system to illustrate real-time control of temperature by controlling the heater elements in real time.

FIG. 1B is an embodiment of a system 150 to illustrate real-time control of temperature by controlling multiple heater elements HE1, HE2, HE3, and HE4 in real time. The system 150 is another example of a wafer processing system.

The system 150 is structurally the same as the system 100 of FIG. 1A except that in the system 150, the sensor 114 is located within the user interface system 112 instead of being located in the multiplexer 106. Moreover, in the system 150, the processor 110 is coupled to the sensor 114 for receiving the voltage value Vsense1 from the sensor 114.

The sensor 114 provides the voltage value Vsense1 to the processor 110 instead of the processor 104. For example, the processor 110 polls the sensor 114 to obtain the voltage amount Vsense1. The processor 110 periodically or continuously, in real time, polls the sensor 114 to obtain multiple measured voltage amounts, such as Vsense. To illustrate, the processor 110 polls, such as sends a poll signal to, the sensor 114 every few microseconds or every few milliseconds. In response to receiving the poll signal from the processor 110, the sensor 114 provides the voltage amount Vsense1 to the processor 110. Upon receiving the voltage value Vsense1 from the sensor 114, the processor 110 calculates the adjusted duty cycles ADC1 through ADC4 to achieve the temperature value Temp1 within the plasma chamber. The remaining operations of the system 150 of the same as the operations of the system 100 of FIG. 1A to achieve the temperature Temp1 within the plasma chamber.

In some embodiments, there is no polling needed by the processor 104 or the processor 110 of the sensor 114. For example, without being requested by the processor 104 or the processor 110, the sensor 114 periodically or continuously, in real time, measures voltage amounts and sends the voltage amounts that are sensed at the point on the rail 102 to the processor 110 or the processor 104. To illustrate, the sensor 114 sends voltage amounts sensed at the rail 102 every few microseconds or every few milliseconds to the processor 104 or the processor 110.

In several embodiments, the non-volatile memory 116 is coupled to the processor 104 instead of being coupled to the processor 110. The mapping is provided from the non-volatile memory 116 to the processor 104 for calculation of one or more of the adjusted duty cycles ADC1 through ADC4.

In various embodiments, the sensor 114 is located outside the user interface system 112 and is located between the user interface system 112 and the rail 102. The sensor 114 is coupled to the processor 110 at one end of the sensor 114 and is coupled to the point on the rail 102 at another end of the sensor 114.

Figure 2:
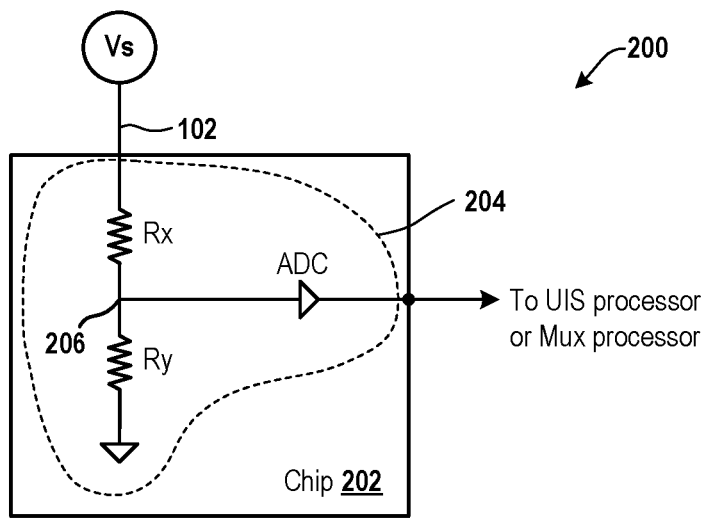
FIG. 2 is a diagram of an embodiment of a voltage sensor.

FIG. 2 is a diagram of an embodiment of a voltage sensor 204, which is an example of the sensor 114 of FIGS. 1A and 1B. The voltage sensor 204 is integrated within an integrated circuit chip 202. The voltage sensor 204 is coupled via the rail 102 to the voltage source Vs to sense the voltage supplied by the voltage source Vs at the point on the rail 102. The voltage sensor 204 includes a resistor Rx, another resistor Ry, and an analog-to-digital converter (ADC). The resistor Ry is coupled to a ground potential. The analog-to-digital converter ADC is coupled to a point 206 between the resistors Rx and Ry to provide a resistor divider. The resistor Rx drops the voltage that is supplied by the voltage source Vs to an amount that can be measured. The analog-to-digital converter ADC converts the voltage amount at the point 206 from an analog format to a digital format and sends the voltage amount in the digital format to the processor 104 of the multiplexer 106 or to the processor 110 of the user interface system 112. The voltage amount at the point 206 is an example of a voltage amount, such as Vsense or Vsense1 or Vsense2 (FIG. 3), that is sensed by the sensor 114.

Figure 3:
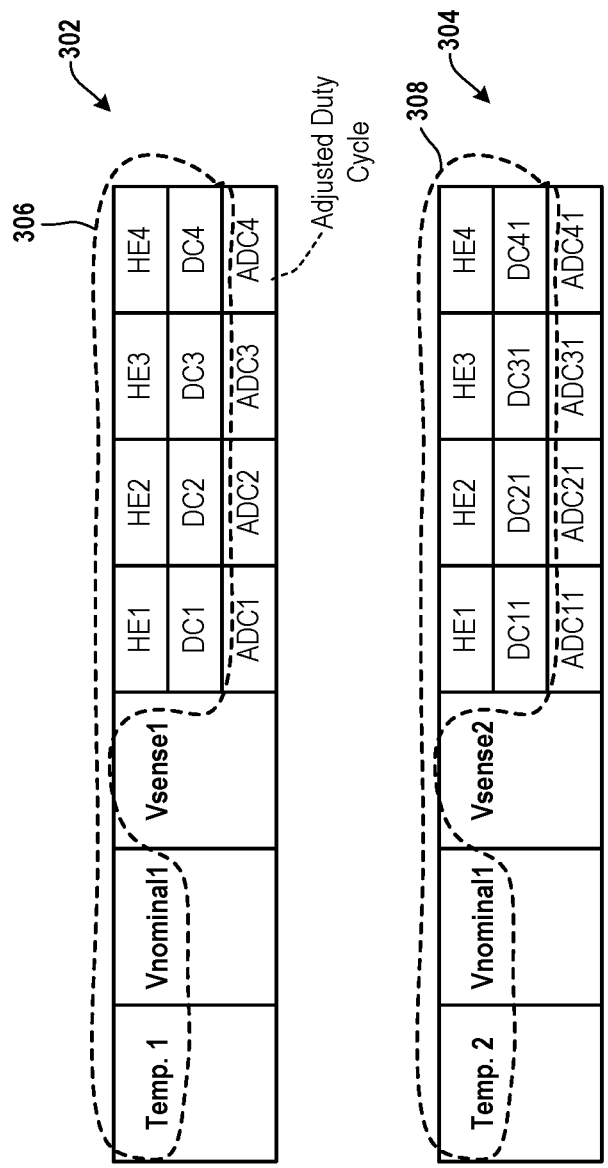
FIG. 3 shows embodiments of multiple tables to illustrate a correspondence between a temperature within a plasma chamber, a nominal voltage generated by a voltage source, duty cycles of the heater elements, and adjusted duty cycles of the heater elements.

FIG. 3 shows embodiments of multiple tables 302 and 304 to illustrate a correspondence between a temperature within the plasma chamber, the nominal voltage generated by the voltage source Vs, duty cycles of the corresponding heater elements HE1 through HE4, and adjusted duty cycles of the corresponding heater elements HE1 through HE4. The table 302 is stored within the memory device 118 of the user interface system 112. Similarly, the table 304 is stored within the memory device 118.

The table 302 includes the mapping 306. A processor, such as a processor 110 or a processor 104, described herein, calculates the adjusted duty cycles ADC1 through ADC4 from the mapping 306 and the amount Vsense1 of the voltage that is supplied by the voltage source Vs and measured by the sensor 114. Moreover, the adjusted duty cycles ADC1 through ADC4 are stored in the table 302 by the processor described herein.

Similarly, the table 304 includes the mapping 308 for achieving the temperature value Temp2. The sensor 114 of FIG. 1A or 1B senses the voltage value Vsense2 during a time period in which the heater elements HE1 through HE4 are operated at the corresponding duty cycles DC11 through DC41. For example, when the heater element HE1 is operated at the duty cycle DC11, the heater element HE2 is operated at the duty cycle DC21, the heater element HE3 is operated at the duty cycle DC31, and the heater element HE4 is operated at the duty cycle DC41, the sensor 114 senses the voltage value Vsense2 at the rail 102. The processor 110 or 104 calculates multiple adjusted duty cycles ADC11, ADC21, ADC31, and ADC41 from the voltage value Vnominal1, the measured value Vsense2, and the corresponding duty cycles DC11 through DC41 in the same manner in which the adjusted duty cycles ADC1 through ADC4 are calculated from the corresponding duty cycles DC1 through DC4, the voltage value Vnominal1, and the measured voltage value Vsense1. The processor 110 stores the adjusted duty cycles ADC11 through ADC41 in the memory device 118 of FIG. 1A of the user interface system 112 or the processor 104 stores the adjusted duty cycles ADC11 through ADC41 in a memory device (not shown) that is coupled to the processor 104. The processor 110 or 104 controls or directs the switch circuit 108 to operate the heater elements HE1 through HE4 at the corresponding adjusted duty cycles ADC11 through ADC41 to achieve the temperature value Temp2 within the plasma chamber in the same manner in which the switch circuit 108 is controlled or directed to operate the heater elements HE1 through HE4 at the corresponding adjusted duty cycles ADC1 through ADC4 to achieve the temperature value Temp1.

In some embodiments, the processor 104 of the multiplexer 106 is coupled to the memory device (not shown) and the tables 302 and 304 are stored within the memory device (not shown).

Figure 4A:
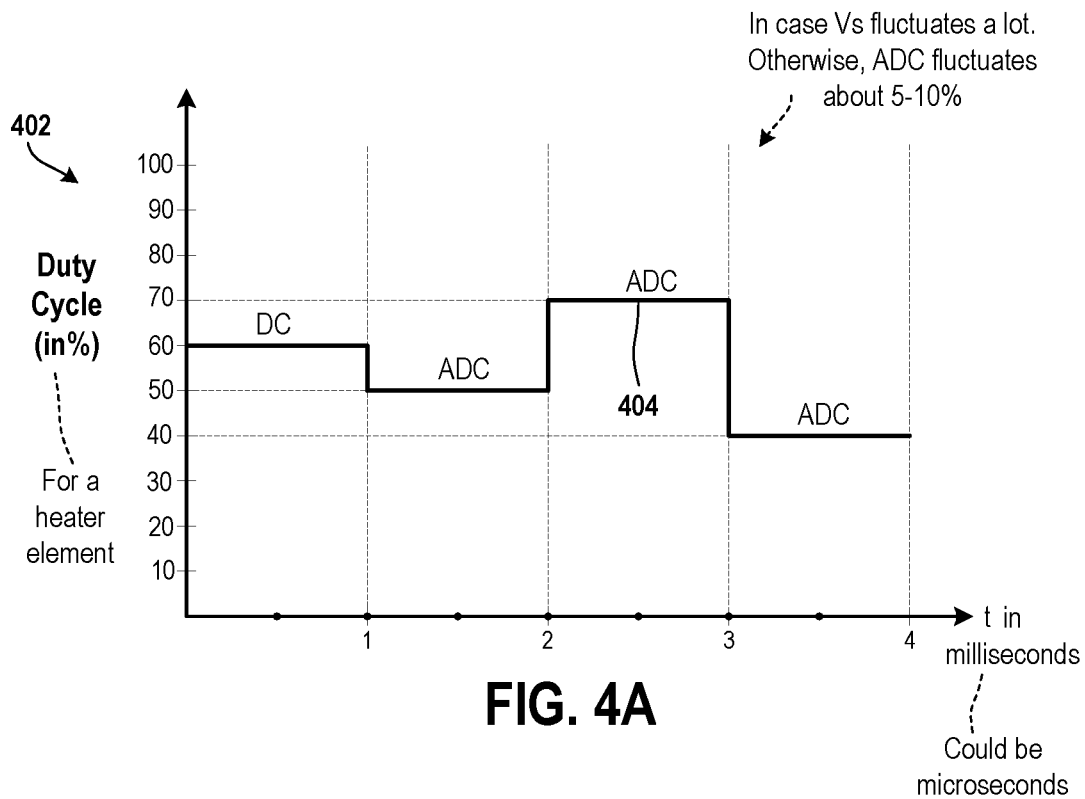
FIG. 4A is an embodiment of a graph to illustrate that the duty cycles or the adjusted duty cycles are adjusted in real time.

FIG. 4A is an embodiment of a graph 402 to illustrate that the duty cycles DC1 through DC4 or the adjusted duty cycles ADC1 through ADC4 are adjusted in real time. The graph 402 plots a duty cycle of a heater element, such as the heater element HE1 or HE2 or HE3 or HE4, versus time t, which is in milliseconds. The graph 402 includes a plot 404. As illustrated in the graph 402, the heater element operates at a duty cycle of 60% for a time period of 1 millisecond from a time of 0 millisecond to a time of 1 millisecond. The duty cycle of 60% is an example of any of the duty cycles DC1 through DC4. The duty cycle of 60% is then adjusted to achieve an adjusted duty cycle of 50%. The adjusted duty cycle of 50% is an example of any of the duty cycles ADC1 through ADC4. The adjusted duty cycle of 50% is maintained for a time period of 1 millisecond between the time of 1 millisecond to a time of 2 millisecond.

The adjusted duty cycle of 50% is then further adjusted to achieve another adjusted duty cycle of 70%. The other adjusted duty cycle of 70% is maintained for a time period of 1 millisecond between the time of 2 millisecond to a time of 3 millisecond. Thereafter, the other adjusted duty cycle of 70% is then adjusted to achieve an additional adjusted duty cycle of 40%. The additional adjusted duty cycle of 40% is maintained for a time period of 1 millisecond between the time of 3 millisecond to a time of 4 millisecond. As such, the duty cycle of the heater element is adjusted every millisecond or the adjusted duty cycle is adjusted every millisecond.

It should be noted that a millisecond is used herein as an example. In some embodiments, the duty cycle of the heater element or the adjusted duty cycle of the heater element is adjusted every few milliseconds, such as every 2 milliseconds or every 3 milliseconds.

In various embodiments, the duty cycle is adjusted to the adjusted duty cycle within a different time period than a time period in which the adjusted duty cycle is adjusted. For example, the duty cycle DC1 is adjusted to the adjusted duty cycle ADC1 within 1 millisecond and the adjusted duty cycle ADC1 is adjusted to another adjusted duty cycle within 2 milliseconds. As another example, the adjusted duty cycle ADC1 is adjusted to another adjusted duty cycle within 1 millisecond and the other adjusted duty cycle is adjusted to an additional adjusted duty cycle within 1.5 milliseconds.

By adjusting the duty cycle or the adjusted duty cycle within one or more milliseconds, the duty cycle or the adjusted duty cycle is adjusted in real time.

It should be noted that although large amounts of fluctuation in the duty cycle or the adjusted duty cycle are illustrated in FIG. 4A, in several embodiments, the duty cycle or the adjusted duty cycle changes by 5 to 10% every millisecond or every few milliseconds. For the large amounts of fluctuation to occur, the measured value of the voltage that is supplied by the voltage source Vs and sensed by the sensor 114 of FIGS. 1A and 1B fluctuates in a substantial manner.

Figure 4B:
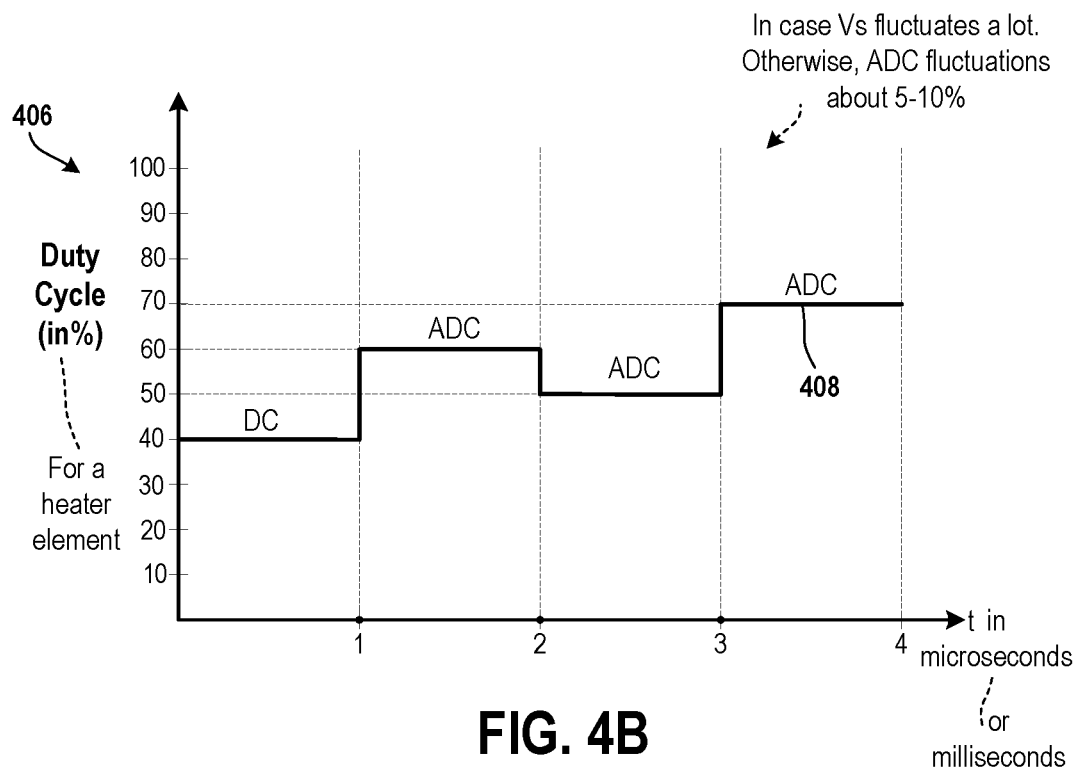
FIG. 4B is an embodiment of a graph to illustrate that the duty cycles or the adjusted duty cycles are adjusted in real time.

FIG. 4B is an embodiment of a graph 406 to illustrate that the duty cycles DC1 through DC4 or the adjusted duty cycles ADC1 through ADC4 are adjusted in real time. The graph 406 plots a duty cycle of a heater element, such as the heater element HE1 or HE2 or HE3 or HE4, versus time t, which is in microseconds. The graph 406 includes a plot 408. As illustrated in the graph 404, the heater element operates at a duty cycle of 40% for a time period of 1 microsecond from a time of 0 microsecond to a time of 1 microsecond. The duty cycle of 40% is an example of any of the duty cycles DC1 through DC4. The duty cycle of 40% is then adjusted to achieve an adjusted duty cycle of 60%. The adjusted duty cycle of 60% is an example of any of the duty cycles ADC1 through ADC4. The adjusted duty cycle of 60% is maintained for a time period of 1 microsecond between the time of 1 microsecond to a time of 2 microsecond.

The adjusted duty cycle of 60% is then adjusted to achieve another adjusted duty cycle of 50%. The other adjusted duty cycle of 50% is maintained for a time period of 1 microsecond between the time of 2 microsecond to a time of 3 microsecond. Thereafter, the other adjusted duty cycle of 50% is then adjusted to achieve an additional adjusted duty cycle of 70%. The additional adjusted duty cycle of 70% is maintained for a time period of 1 microsecond between the time of 3 microsecond to a time of 4 microsecond. As such, the duty cycle of the heater element is adjusted every microsecond or the adjusted duty cycle is adjusted every microsecond.

It should be noted that a microsecond is used herein as an example. In some embodiments, the duty cycle of the heater element or the adjusted duty cycle of the heater element is adjusted every few microseconds, such as every 2 microseconds or every 3 microseconds.

In various embodiments, the duty cycle is adjusted to the adjusted duty cycle within a different time period than a time period in which the adjusted duty cycle is adjusted. For example, the duty cycle DC1 is adjusted to the adjusted duty cycle ADC1 within 1 microsecond and the adjusted duty cycle ADC1 is adjusted to another adjusted duty cycle within 2 microseconds. As another example, the adjusted duty cycle ADC1 is adjusted to another adjusted duty cycle within 1 microsecond and the other adjusted duty cycle is adjusted to an additional adjusted duty cycle within 1.5 microseconds.

By adjusting the duty cycle or the adjusted duty cycle within one or more microseconds, the duty cycle or the adjusted duty cycle is adjusted in real time.

It should be noted that although large amounts of fluctuation in the duty cycle or the adjusted duty cycle are illustrated in FIG. 4B, in several embodiments, the duty cycle or the adjusted duty cycle changes by 5 to 10% every microsecond or every few microseconds.

FIG. 5 is a diagram of an embodiment of a plasma system 500 to illustrate use of the heater elements HE1 through HE4 within the plasma system 500. The plasma system 500 is an example of a wafer processing system. The plasma system 500 includes a radio frequency generator (RFG) 510, an impedance matching circuit (IMC) 516, a plasma chamber 502, the user interface system 112, and the multiplexer 106. An impedance matching circuit, as used herein, is sometimes referred to as an impedance matching network or an impedance match.

An input of the impedance matching circuit 516 is coupled to the RF generator 510 via an RF cable 512 and an output of impedance matching circuit 516 is coupled to a lower electrode 508 of the plasma chamber 502 via an RF transmission line 518. An example of the RF generator 510 is a generator that has a frequency of operation in kilohertz (kHz). To illustrate, the RF generator 510 operates at a frequency of 200 kHz or 400 kHz. Another example of the RF generator is a generator that has a frequency of operation in megahertz (MHz). To illustrate, the RF generator 510 operates at a frequency of 2 MHz, 13.56 MHz, 27 MHz, or 60 MHz.

An impedance matching circuit, as described herein, is a network of one or more components, such as one or more resistors, or one or more capacitors, or one or more inductors, or a combination thereof, that match an impedance of a load coupled to an output of the impedance matching circuit with an impedance of a source coupled to one or more inputs of the impedance matching circuit. Two or more of the components are coupled to each other in a parallel or serial manner Examples of the load coupled to the output of impedance matching circuit 516 include the plasma chamber 502 and the RF transmission line 518. Moreover, examples of the source coupled to the input of the impedance matching circuit 516 include the RF cable 512 and the RF generator 510.

The plasma chamber 502 includes an upper electrode 506 and a substrate support 504, such as a chuck. The substrate support 504 is an example of the electrode assembly 101 of FIG. 1A or 1B. The substrate support 504 includes the lower electrode 508 and a heater system 520, which includes the heater elements HE1 through HE4. The lower electrode 508 and the heater system 520 are embedded within the substrate support 504 on which a substrate S, such as a semiconductor wafer, is placed. Examples of the chuck include the electrostatic chuck or a magnetic chuck. The substrate support 504 faces the upper electrode 506. The upper electrode 506 is coupled to a ground potential. Each of the lower electrode 508 and the upper electrode 506 is made from a metal, such as aluminum or an alloy of aluminum. The lower electrode 508 is located above the heater system 520.

The user interface system 112 is coupled to the RF generator 510 via a transfer cable. The processor 110 of the user interface system 112 provides one or more power levels and/or one or more frequency levels to the RF generator 510. The one or more power levels and the one or more frequency levels are a portion of the recipe, which is stored in the memory device 118 of the user interface system 112. The RF generator 510 generates an RF signal having the one or more power levels and/or the one or more frequency levels and supplies the RF signal via the RF cable 512 to the impedance matching circuit 516. The impedance matching circuit 516 matches an impedance of the load coupled to the output of the impedance matching circuit 516 with that of the source coupled to the input of the impedance matching circuit 516 to generate a modified RF signal from the RF signal received via the RF cable 512. The impedance matching circuit 516 provides the modified RF signal via the RF transmission line 518 to the lower electrode 508 of the plasma chamber 502.

When the one or more process gases are supplied to the plasma chamber 502 in addition to supplying the modified RF signal, plasma is stricken or maintained within the plasma chamber 502 to process the substrate S. Examples of the one or more process gases include an oxygen-containing gas, such as $O_2$. Other examples of the one or more process gases include a fluorine-containing gas, e.g., tetrafluoromethane ($CF_4$), sulfur hexafluoride ($SF_6$), hexafluoroethane ($C_2F_6$), etc. Examples of processing the substrate S include depositing one or more materials on the substrate S, etching the substrate S, sputtering the substrate S, and cleaning the substrate S.

During processing of the substrate S, the processor 110 of the user interface system 112 and/or the processor 104 of the multiplexer 106 applies the method described above with reference to FIG. 1A or 1B to adjust one or more of the duty cycles DC1 through DC4 to the corresponding one or more adjusted duty cycles ADC1 through ADC4 to achieve the temperature value Temp1 within the plasma chamber 502.

Moreover, the processor 110 of the user interface system 112 and/or the processor 104 of the multiplexer 106 applies the method described above to adjust one or more of the duty cycles DC11 through DC41 to the corresponding one or more adjusted duty cycles ADC11 through ADC41 to achieve the temperature value Temp2 within the plasma chamber 502.

In some embodiments, instead of being embedded within the substrate support 504, the heater system 520 is embedded within the upper electrode assembly that includes the upper electrode 506 and the lower electrode 508 is coupled to the ground potential.

In several embodiments, instead of being embedded within the substrate support 504, the heater system 520 is embedded within the upper electrode assembly that includes the upper electrode 506 and the lower electrode 508 is coupled to one or more RF generators.

In various embodiments, instead of being coupled to the ground potential, the upper electrode 506 is coupled to one or more RF generators.

FIG. 6 is a diagram of an embodiment of a system 600 to illustrate use of the heater system 520 within a showerhead 616 of a plasma chamber 602. The system 600 is another example of a wafer processing system. The system 600 includes the voltage source Vs, the rail 102, the multiplexer 106, the user interface system 112, a radio frequency generator 606, and impedance matching circuit 608, and the plasma chamber 602. The user interface system 112 is coupled to the RF generator 606 via a transfer cable. Moreover, the RF generator 606 is coupled to an input of the impedance matching circuit 608 via an RF cable 610 and an output of the impedance matching circuit 608 is coupled to an upper electrode 620 within the showerhead 616 via an RF transmission line 612. The plasma chamber 602 includes a substrate support 604 that faces the showerhead 616 to form a gap between the showerhead 616 and the substrate support 604. The showerhead 616 is an example of the electrode assembly 101 of FIG. 1A or 1B. Within the substrate support 604, a lower electrode 614 is embedded. Moreover, the heater system 520 is embedded within the showerhead 616. The heater system 520 is located above the upper electrode 620. The lower electrode 614 is coupled to the ground potential. The substrate S is placed on top of the substrate support 604 for processing of the substrate S.

The user interface system 112 controls the RF generator 606 based on the recipe. Upon receiving the one or more power levels and/or the one or more frequency levels of the recipe, the RF generator 606 generates and supplies an RF signal via the RF cable 610 to the impedance matching circuit 608. The impedance matching circuit 608 modifies the RF signal received from the RF generator 606 to match an impedance of a load coupled to the output of the impedance matching circuit 608 with an impedance of a source coupled to the input of impedance matching circuit 608 to output a modified RF signal. An example of the load coupled to the output of the impedance matching circuit 608 includes the plasma chamber 602 and the RF transmission line 612 and an example of the source coupled to the input of impedance matching circuit 608 includes the RF generator 606 and the RF cable 610.

The showerhead 616 includes multiple holes that are used to transfer the one or more process gases or one or more liquid metals to the gap between the showerhead 616 and the substrate support 604. When the one or more process gases or the one or more liquid metals are supplied to the gap between the showerhead 616 and the substrate support 604 in addition to supplying the modified RF signal from the impedance matching circuit 608 to the upper electrode 620, plasma is stricken or maintained within the plasma chamber 602 to process the substrate S. For example, the showerhead 616 is used to perform plasma enhanced atomic layer deposition (PEALD) or plasma enhanced chemical vapor deposition (PECVD) on the substrate S. The voltage source Vs is coupled to the heater system 520 in a manner described above with reference to FIGS. 1A and 1B via the rail 102. The method described above with reference to FIG. 1A or 1B is applied to the system 600.

In some embodiments, instead of the lower electrode 614 being coupled to the ground potential, the upper electrode 620 is coupled to the ground potential and the lower electrode 614 is coupled to the RF generator 606 via the RF transmission line 612, the impedance matching circuit 608, and the RF cable 610.

In various embodiments, the upper electrode 620 is coupled to the RF generator 606 and the lower electrode 614 is coupled to another RF generator (not shown) via an impedance matching circuit (not shown).

FIG. 7 is a diagram of an embodiment of the system 700 to illustrate use of the heater system 520 within an inductively coupled plasma (ICP) chamber 702. The system 700 is an example of a wafer processing system. The system 700 includes the user interface system 112, the multiplexer 106, an RF generator 706, an impedance matching circuit 720, an RF coil 712, and the plasma chamber 702. The plasma chamber 702 includes a dielectric window 718. The RF coil 712 is located above the dielectric window 718.

The user interface system 112 is coupled via a transfer cable to the RF generator 706, which is coupled via an RF cable 708 to an input of the impedance matching circuit 720. Moreover, an output of impedance matching circuit is coupled via an RF transmission line 710 to the RF coil 712. The user interface system 112 whites the one or more power levels and/or the one or more frequency levels to the RF generator 706. The RF generator 706 generates an RF signal having the one or more power levels and/or the one or more frequency levels and sends the RF signal via the RF cable 708 to the input of impedance matching circuit 720.

The plasma chamber 702 includes a substrate support 704, within which a lower electrode 716 is embedded. The substrate support 704 is an example of the electrode assembly 101 of FIG. 1A or 1B. The lower electrode 716 is coupled to a ground potential. The heater system 520 is embedded within the substrate support 704 and is located below the lower electrode 716. The substrate S is overlaid on top of the substrate support 704 for processing.

The impedance matching circuit 720 matches an impedance of a load coupled to the output of the impedance matching circuit 720 with that of a source coupled to the input of the impedance matching circuit 720 to output a modified RF signal at the output of the impedance matching circuit. An example of the load coupled to the output of impedance matching circuit includes the RF transmission line 710 and the RF coil 712. An example of the source coupled to the input of the impedance matching circuit 720 include the RF generator 706 and the RF cable 708. The RF coil 712 receives the modified RF signal from the output of impedance matching circuit 720 via the RF transmission line 710. When the one or more process gases are supplied to the plasma chamber 702 and RF power of the modified RF signal that is provided to the RF coil 712 is inductively coupled with the plasma chamber 702, plasma is stricken or maintained within the plasma chamber 702 to process the substrate S.

The voltage source Vs is coupled via the rail 102 to the heater system 520. The user interface system 112 and the multiplexer 106 execute the process described above with reference to FIG. 1A or with reference to FIG. 1B to control the heater elements HE1 through HE4 to adjust one or more of the duty cycles DC1 through DC4 to generate and apply the corresponding one or more adjusted duty cycles ADC1 through ADC4.

In some embodiments, instead of the RF coil 712, multiple RF coils 712 are located above the dielectric window 718. In various embodiments, instead of or in addition to the RF coil 712, one or more RF coils are located adjacent to a side wall SW of the plasma chamber 702. In several embodiments, a Faraday shield is placed below and adjacent to the dielectric window 718 to clean the dielectric window 718 to free the dielectric window 718 from materials that are deposited on the dielectric window 718.

In various embodiments, the lower electrode 716 is coupled to another RF generator (not shown) via an impedance matching circuit instead of being coupled to the ground potential.

FIG. 8 is a diagram of an embodiment of a system 800 to illustrate chamber-to-chamber matching in which the same temperature value Temp1 is achieved within a plasma chamber 802 as that achieved within the plasma chamber 502 of FIG. 5. The system 800 is another example of a wafer processing system. The system 800 includes the user interface system 112, a multiplexer 818, an RF generator 810, an impedance matching circuit 814, and the plasma chamber 802. The system 800 further includes the voltage source Vs and a rail 806.

The user interface system 112 is coupled via a transfer cable to the RF generator 810. The RF generator 810 is coupled via an RF cable 812 to an input of an impedance matching circuit 814. An output of impedance matching circuit 814 is coupled via an RF transmission line 816 to a lower electrode 808 of the plasma chamber 802. The plasma chamber 802 further includes an upper electrode 807, which is coupled to a ground potential. The lower electrode 808 is embedded within a substrate support 804, such as a chuck, and the substrate support 804 faces the upper electrode 807. The substrate S is placed on top of the substrate support 804. A heater system 820 is also embedded within the substrate support 804 and is located below the lower electrode 808. The heater system 820 includes multiple heater elements HE5, HE6, HE7, and HE8. The heater elements HE5 through HE8 are coupled to the voltage source Vs via the rail 806 in the same manner in which the heater elements HE1 through HE4 of FIG. 1A or 1B are coupled to the voltage source Vs why the rail 102 of FIG. 1A or 1B.

The upper electrode 807 is made from a metal, such as aluminum or an alloy of aluminum. Moreover, the lower electrode 808 is fabricated from a metal, such as aluminum or an alloy of aluminum. The multiplexer 818 is the same in structure as that of the multiplexer 106 of FIG. 1A or 1B. For example, the multiplexer 818 includes a processor 811, a switch circuit 813, and a sensor 815. The processor 811 is the same in structure as that of the processor 104 of FIG. 1A or 1B, the switch circuit 813 is the same in structure as that of the switch circuit 108 of FIG. 1A or 1B, and the sensor 815 is the same in structure as that of the sensor 114 of FIG. 1A or 1B. The processor 811 is coupled to the processor 110 via a transfer cable. Moreover, the sensor 815 is coupled to the heater system 820, and is also coupled to the voltage source Vs via the rail 806. Also, the switch circuit 813 is coupled to the heater elements HE5 through HE8 of the heater system 820 in the same manner in which the switch circuit 108 is coupled to the heater elements HE1 through HE4 of FIG. 1A or 1B.

The system 800 includes a non-volatile memory 817, such as a flash memory device, which is coupled to the processor 110. A mapping between multiple duty cycles DC5, DC6, DC7, and DC8 at which corresponding ones of the heater elements HE5 through HE8 are to be operated during processing of the substrate S within the plasma chamber 802 and the temperature value Temp1 is stored within the non-volatile memory 817. For example, the heater element HE5 is to be operated at the duty cycle DC5, the heater element HE6 is to be operated at the duty cycle DC6, the heater element HE7 is to be operated at the duty cycle DC7, and the heater element HE8 is to be operated the duty cycle DC8 to achieve the temperature value Temp1 within the plasma chamber 802. The mapping accessed by the processor 811 includes a correspondence, such as a one-to-one relationship, between the temperature value Temp1 and the duty cycles DC5 through DC8 for achieving the temperature value Temp1. In addition, the mapping includes the voltage value Vnominal1 that the voltage source Vs is to generate during processing of the substrate S. The processor 811 receives, such as accesses, the mapping between the multiple duty cycles DC5 through DC8 at which corresponding ones of the heater elements HE5 through HE8 are to be operated to achieve the temperature value Temp1.

During processing of the substrate S, the processor 110 controls the heater elements HE5 through HE8 to operate at the corresponding duty cycles DC5 through DC8 in the same manner in which the heater elements HE1 through HE4 are controlled to operate at the corresponding duty cycles DC1 through DC4. For example, the processor 110 sends a duty cycle control signal to the processor 811 to control the heater elements HE5 through HE8 to operate at the corresponding duty cycles DC5 through DC8. When the heater elements HE5 through HE8 are operated at the corresponding duty cycles DC5 through DC8 to achieve the temperature value Temp1 within the plasma chamber 802, the sensor 815 senses a voltage value VsenseM at the rail 806. The heater elements HE5 through HE8 are operated in the same manner in which the heater elements HE1 through HE4 are operated by controlling switches (not shown) of the heater system 820 that are coupled to the corresponding heater elements HE5 through HE8. The voltage value VsenseM is provided by the sensor 815 to the processor 811 and the processor 811 sends the voltage value VsenseM to the processor 110 via the transfer cable coupled to the processors 110 and 811.

The processor 110 calculates one or more adjusted duty cycles ADC5, ADC6, ADC7, and ADC8 from the corresponding one or more duty cycles DC5 through DC8 in the same manner in which the processor 110 calculates one or more of the adjusted duty cycles ADC1 through ADC4 from the corresponding one or more duty cycles DC1 through DC4. For example, the processor 110 calculates the adjusted duty cycle ADC5 as being equal to a product of the duty cycle DC5 and a square of a ratio of the voltage value Vnominal1 and the voltage value VsenseM. As another example, the processor 110 calculates the adjusted duty cycle ADC6 as being equal to a product of the duty cycle DC6 and a square of a ratio of the voltage value Vnominal1 and the voltage value VsenseM. As yet another example, the processor 110 calculates the adjusted duty cycle ADC7 as being equal to a product of the duty cycle DC7 and a square of a ratio of the voltage value Vnominal1 and the voltage value VsenseM. Also, as another example, the processor 110 calculates the adjusted duty cycle ADC8 as being equal to a product of the duty cycle DC8 and a square of a ratio of the voltage value Vnominal1 and the voltage value VsenseM.

When the substrate S is being processed within the plasma chamber 802, the processor 110 adjusts one or more of the duty cycles DC5 through DC8 in the same manner in which the processor adjusts one or more of the duty cycles DC1 through DC4. For example, upon computing the adjusted duty cycles ADC5 through ADC8, the processor 110 sends an adjusted-duty-cycle control signal to the processor 811 for controlling the heater element HE5 to achieve the adjusted duty cycle ADC5, for controlling the heater element HE6 to achieve the adjusted duty cycle ADC6, for controlling the heater element HE7 to achieve the adjusted duty cycle ADC7, and for controlling the heater element HE8 to achieve the adjusted duty cycle ADC8. For example, the processor 110 generates and sends the adjusted-duty-cycle control signal to the processor 811 within a few microseconds, such as one or more microseconds, after sending the duty-cycle control signal to the processor 811. As another example, the processor 110 generates and sends the adjusted-duty-cycle control signal to the processor 811 within a few milliseconds, such as one or more milliseconds, after sending the duty-cycle control signal to the processor 811. By adjusting one or more of the duty cycles DC5 through DC8 every few milliseconds or microseconds, the duty cycles DC5 through DC8 are adjusted in real time.

The adjusted-duty-cycle control signal includes frequencies for opening and closing the switches of the switch circuit 813 to achieve the duty cycles ADC5 through ADC8. Upon receiving the adjusted-duty-cycle control signal, the processor 811 generates and sends multiple adjusted-duty-cycle select signals and sends the adjusted-duty-cycle select signals to the switch circuit 813. In response to receiving the adjusted-duty-cycle select signals, the switch circuit 813 closes some of its switches and opens the remaining of the switches to achieve the adjusted duty cycles ADC5 through ADC8.

During a time period in which the corresponding two switches of the switch circuit 813 are closed upon receiving the corresponding two adjusted-duty-cycle select signals, the nominal voltage value Vnominal1 that is generated by the voltage source Vs is transferred via the rail 806, the corresponding y bus of the heater system 820, the corresponding switch of the heater system 820 coupled to the corresponding y bus of the heater system 820, the corresponding heater element coupled to the corresponding y bus, the corresponding x bus of the heater system 820 coupled to the corresponding heater element, and the corresponding switch of the heater system 820 coupled to the corresponding x bus of the heater system 820 to the ground potential to achieve an on period of the adjusted duty cycle, such as ADC5, ADC6, ADC7, or ADC8. For the remaining period of a clock cycle, the nominal voltage value Vnominal1 that is generated by the voltage source Vs is not transferred via the rail 806, the corresponding y bus of the heater system 820, the corresponding switch of the heater system 820 coupled to the corresponding y bus of the heater system 820, the corresponding heater element coupled to the corresponding y bus, the corresponding x bus of the heater system 820 coupled to the corresponding heater element, and the corresponding switch of the heater system 820 coupled to the corresponding x bus of the heater system 820 to the ground potential to achieve an off period of the adjusted duty cycle, such as ADC5, ADC6, ADC7, or ADC8.

One or more of the duty cycles DC5 through DC8 of the corresponding one or more heater elements HE5 through HE8 are adjusted to the corresponding one or more duty cycles ADC5 through ADC8 to achieve the temperature value Temp1 within the plasma chamber 802. The temperature value Temp1 is the same as that of the temperature value Temp1 to be achieved within the plasma chamber 502 of FIG. 5 to achieve chamber-to-chamber matching in processing the substrate S. For example, when the same recipe is applied to the substrate S in both the plasma chambers 502 and 802 in addition to applying the same temperature value Temp1, the substrate S is processed, such as etched or cleaned, in a substantially uniform manner in both the plasma chambers 502 and 802. For example, substantially the same etch rate or the same deposition rate is achieved in both the plasma chambers 502 and 802. To illustrate, the etch rate of etching the substrate S within the plasma chamber 502 is within a pre-determined value of the etch rate of etching the substrate S within the plasma chamber 802. As another illustration, the deposition rate of depositing a material on the substrate S within the plasma chamber 502 is within a pre-set value of the depositing a material on the substrate S within the plasma chamber 802.

It should be noted that although the same voltage source Vs is illustrated in FIGS. 1 and 5, one and the same voltage source Vs is not used in both the systems 500 and 800. For example, the voltage source Vs used in the system 500 is a separate voltage source than the voltage source Vs used in the system 800. Both the voltage sources Vs used in the systems 500 and 800 are designed and specified to generate the same amount of nominal voltage Vnominal1.

In some embodiments, the non-volatile memory 817 is received by a user of the heater system 820 at a time the user receives the heater system 820. For example, the mapping that is stored in the non-volatile memory 817 is specific to the heater elements HE5 through HE8 and can be different for a different set of heater elements. As another example, the duty cycles DC5 through DC8 are pre-calibrated at a factory in which the substrate support 804 is fabricated assuming the voltage source Vs has the constant value, such as the nominal value Vnominal1.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller, as described herein, is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for achieving a target temperature within a plasma chamber of a wafer processing system, the wafer processing system including a plurality of heater elements disposed within the plasma chamber and a voltage source configured to supply a voltage to the plurality of heater elements via a rail, comprising:

maintaining mapping information between the target temperature and a plurality of duty cycles corresponding to the plurality of heater elements, wherein the mapping information includes a nominal voltage associated with the voltage source;

measuring a voltage at the rail that couples the voltage source to a plurality of switches that are coupled to the plurality of heater elements, wherein the rail is coupled via the plurality of switches to a multiplexer, wherein the measuring is performed by a voltage sensor coupled to the rail;

creating one or more adjusted duty cycles for corresponding one or more of the plurality of heater elements based on the nominal voltage, a corresponding one or more of the plurality of duty cycles, and the measured voltage; and applying the one or more adjusted duty cycles to the corresponding one or more of the plurality of heater elements to further achieve the target temperature within the plasma chamber.

2. The method of claim 1, wherein measuring the voltage comprises:
measuring the voltage on a periodic basis, wherein the one or more adjusted duty cycles are created following the periodic basis.

3. The method of claim 2, wherein the periodic basis is every microsecond or every millisecond.

4. The method of claim 1, wherein each of the one or more adjusted duty cycles is calculated as a product of the corresponding one of the plurality of duty cycles and a square of a ratio of the nominal voltage and the measured voltage.

5. The method of claim 1, wherein the method is used across a plurality of plasma chambers to achieve the target temperature and facilitate chamber-to-chamber matching.

6. The method of claim 1, further comprising:
measuring one or more additional parameter values at corresponding locations along the rail,
wherein the creating one or more adjusted duty cycles further comprises:
creating the one or more adjusted duty cycles based on the nominal voltage, the corresponding one or more of the plurality of duty cycles, the measured voltage and the one or more additional parameter values.

7. The method of claim 6, further comprising:
creating one or more statistically adjusted duty cycles for the corresponding one or more of the plurality of heater elements based on the one or more adjusted duty cycles.

8. The method of claim 7, further comprising:
applying the one or more statistically adjusted duty cycles to the corresponding one or more of the plurality of heater elements.

9. The method of claim 1, wherein the method is executed in real time during substrate processing.

10. The method of claim 1, wherein the method is executed without a substrate being processed.

11. The method of claim 10, wherein the method is executed to recondition the plasma chamber.

12. A system for achieving a target temperature within a plasma chamber of a wafer processing system, the wafer processing system including a plurality of heater elements disposed within the plasma chamber and a voltage source configured to supply a voltage to the plurality of heater elements via a rail, the system comprising:
a memory device configured to maintain mapping information between the target temperature and a plurality of duty cycles corresponding to the plurality of heater elements, wherein the mapping information includes a nominal voltage associated with the voltage source;
a voltage sensor coupled to the rail, wherein the rail couples the voltage source to a plurality of switches that are coupled to the plurality of heater elements, wherein the rail is coupled via the plurality of switches to a multiplexer, wherein the voltage sensor is configured to measure a voltage at the rail; and
a processor configured to:
create one or more adjusted duty cycles for corresponding one or more of the plurality of heater elements based on the nominal voltage, a corresponding one or more of the plurality of duty cycles, and the measured voltage; and
apply the one or more adjusted duty cycles to the corresponding one or more of the plurality of heater elements to further achieve the target temperature within the plasma chamber.

13. The system of claim 12, further comprising:
a switch circuit controllable by the processor and configured to control the plurality of heater elements.

14. The system of claim 13, wherein the processor is configured to direct the switch circuit to apply the one or more adjusted duty cycles to the corresponding one or more of the plurality of heater elements to achieve the target temperature.

15. The system of claim 12, wherein the system is coupled to a substrate support within the plasma chamber.

16. The system of claim 12, wherein the processor is configured to poll the voltage sensor on a periodic basis to receive the measured voltage and create the one or more adjusted duty cycles following the periodic basis.

17. The system of claim 16, wherein the periodic basis is every microsecond or every millisecond.

18. The system of claim 12, wherein each of the one or more adjusted duty cycles is calculated as a product of the corresponding one of the plurality of duty cycles and a square of a ratio of the nominal voltage and the measured voltage.

19. The system of claim 12, further comprising one or more additional voltage sensors configured to measure one or more additional parameter values at corresponding locations along the rail, and wherein the processor is configured to create the one or more adjusted duty cycles based on the nominal voltage, the corresponding one or more of the plurality of duty cycles, the measured voltage and the measured one or more additional parameter values.

20. The system of claim 19, wherein the processor is configured to create one or more statistically adjusted duty cycles for the corresponding one or more of the plurality of heater elements based on the one or more adjusted duty cycles.

21. The system of claim 20, wherein the processor is configured to apply the one or more statistically adjusted duty cycles to the corresponding one or more of the plurality of heater elements.

22. The system of claim 12, wherein the processor is configured to create the one or more adjusted duty cycles in real time during substrate processing.

23. The system of claim 12, wherein the processor is configured to create the one or more adjusted duty cycles to recondition the plasma chamber without a substrate being processed.

24. A controller system comprising:
a memory device configured to maintain mapping information between a target temperature within a plasma chamber and a plurality of duty cycles corresponding to a plurality of heater elements within the plasma chamber, wherein the mapping information includes a nominal voltage associated with a voltage source that is coupled via a rail to the plurality of heater elements;

a multiplexer, and a processor coupled to the memory device and the multiplexer, wherein the processor is configured to:

receive a voltage measured by a voltage sensor coupled to the rail, wherein the rail couples the voltage source to a plurality of switches that are coupled to the plurality of heater elements, wherein the rail is coupled via the plurality of switches to the multiplexer;

generate one or more adjusted duty cycles for corresponding one or more of the plurality of heater elements based on the nominal voltage, a corresponding one or more of the plurality of duty cycles, and the measured voltage; and control the multiplexer to apply the one or more adjusted duty cycles to the corresponding one or more of the plurality of heater elements, wherein the one or more adjusted duty cycles are applied to the corresponding one or more of the plurality of heater elements to achieve the target temperature within the plasma chamber.

25. The controller system of claim 24, wherein the processor is configured to direct a switch circuit to apply the one or more adjusted duty cycles to the corresponding one or more of the plurality of heater elements to achieve the target temperature.

26. The controller of system claim 24, wherein the processor is configured to calculate each of the one or more adjusted duty cycles as a product of the corresponding one of the plurality of duty cycles and a square of a ratio of the nominal voltage and the measured voltage.

* * * * *